(12) United States Patent
Hamada et al.

(10) Patent No.: US 6,552,609 B2
(45) Date of Patent: Apr. 22, 2003

(54) SIGNAL DISTORTION COMPENSATING APPARATUS AND METHOD

(75) Inventors: Hajime Hamada, Kawasaki (JP); Yasuyuki Oishi, Kawasaki (JP); Takuro Kubo, Kawasaki (JP); Takayoshi Ode, Kawasaki (JP); Kazuo Nagatani, Kawasaki (JP); Hiroyoshi Ishikawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 54 days.

(21) Appl. No.: 09/784,601

(22) Filed: Feb. 15, 2001

(65) Prior Publication Data

US 2002/0041208 A1 Apr. 11, 2002

(30) Foreign Application Priority Data

Oct. 3, 2000 (JP) .......................... 2000-303748

(51) Int. Cl.$^7$ ................................................ H03F 1/26
(52) U.S. Cl. ...................................... 330/149; 330/136
(58) Field of Search ........................... 330/2, 107, 136, 330/149

(56) References Cited

U.S. PATENT DOCUMENTS 5,917,373 A * 6/1999 Twitchell .................... 330/149

* cited by examiner

Primary Examiner—Steven J. Mottola
(74) Attorney, Agent, or Firm—Katten Muchin Zavis Rosenman

(57) ABSTRACT

Digital input signals $x_i$ and $x_q$ are multiplied by an multiplier 31 with a distortion compensation coefficient of a distortion compensation coefficient storage unit 33 and then processed by a modulation/amplification unit 1 for sending in the form of analog output signals Z. The analog output signals Z are fed back for processings by an attenuator 43, a mixer 41, a quadrature demodulator 39, etc., and then fed to subtractors 35i and 35q. The subtractors 35i and 35q find differences (errors) between analog input signals $X_i$ and $X_q$ and analog feedback signals $Y_i$ and $Y_q$, respectively, and feeds the analog error signals to ADCs 36i and 36q, respectively. The ADCs 36i and 36q convert the analog error signals into digital signals and feeds the digital signals to a distortion compensation coefficient arithmetic unit 5. The distortion compensation coefficient arithmetic unit 5 figures out a new distortion compensation coefficient to update the distortion compensation coefficient storage unit 33.

21 Claims, 12 Drawing Sheets

| INPUT | | | | OUTPUT | | ROTATIONAL ANGLE |
|---|---|---|---|---|---|---|
| SIGN OF hi | SIGN OF hq | SIGN OF yi | SIGN OF yq | OUTPUT Ti | OUTPUT Tq | |
| 0 | 0 | 0 | 0 | -eq(n) | ei(n) | $\pi/2$ |
| 0 | 0 | 0 | 1 | ei(n) | eq(n) | 0 |
| 0 | 0 | 1 | 0 | -ei(n) | -eq(n) | $\pi$ |
| 0 | 0 | 1 | 1 | eq(n) | -ei(n) | $3\pi/2$ |
| 0 | 1 | 0 | 0 | ei(n) | eq(n) | 0 |
| 0 | 1 | 0 | 1 | eq(n) | -ei(n) | $3\pi/2$ |
| 0 | 1 | 1 | 0 | -eq(n) | ei(n) | $\pi/2$ |
| 0 | 1 | 1 | 1 | -ei(n) | -eq(n) | $\pi$ |
| 1 | 0 | 0 | 0 | -ei(n) | -eq(n) | $\pi$ |
| 1 | 0 | 0 | 1 | -eq(n) | ei(n) | $\pi/2$ |
| 1 | 0 | 1 | 0 | eq(n) | -ei(n) | $3\pi/2$ |
| 1 | 0 | 1 | 1 | ei(n) | eq(n) | 0 |
| 1 | 1 | 0 | 0 | eq(n) | -ei(n) | $3\pi/2$ |
| 1 | 1 | 0 | 1 | -ei(n) | -eq(n) | $\pi$ |
| 1 | 1 | 1 | 0 | ei(n) | eq(n) | 0 |
| 1 | 1 | 1 | 1 | -eq(n) | ei(n) | $\pi/2$ |

FIG. 3

SIGNAL DISTORTION COMPENSATING APPARATUS AND METHOD

BACKGROUND OF THE INVENTION

1. Field of the Invention

The present invention relates to a distortion compensating apparatus and method for compensating distortions of an amplifier that amplifies analog signals converted from digital input signals.

2. Description of the Related Arts

It is ideally desirable that amplifiers for amplification and output of input signals have a proportional relationship (linear relationship) between its input signal power (input power) and output signal power (output power) as indicated by an imaginary line (chain double-dashed line) in FIG. 15.

The actual amplifiers however generically have input/output characteristics indicated by a solid line in FIG. 15, i.e., in the relatively small input power region (linear region) the input power is proportional to the output power whereas in the relatively large input power region (nonlinear region or saturated region) the input power is not proportional to the output power but the output power tends to become saturated with larger distortions accordingly as the input power increases.

In order to use the amplifiers with a high energy efficiency, use in the larger input power region is preferred and hence the amplifiers are typically used in the nonlinear region. Transmitters are thus provided with a distortion compensating apparatus arranged to compensate output signal distortions in the nonlinear region so as to allow the output signals to be proportional to the input signals.

FIG. 16 is a block diagram showing the configuration of a transmitter equipped with a conventional adaptive predistortor type distortion compensator which is one of the distortion compensating apparatuses.

This transmitter has input terminals $S_i$ and $S_q$ that receive an I channel (Ich) digital signal $x_i$ and a Q channel (Qch) digital signal $x_q$, respectively, both in the form of base band signals. These signals are fed to a power calculating unit 100 and a multiplier 102.

The power calculation unit 100 finds power values p of the fed digital signals $x_i$ and $x_q$ and feeds the power values p to a distortion compensation coefficient storage unit 101. The distortion compensation coefficient storage unit 101 has distortion compensation coefficients which correspond to various input power values p and, when a power value p is received, it feeds to the multiplier 102 a distortion compensation coefficient h ($h_i$ corresponding to Ich and $h_q$ corresponding to Qch) corresponding to that power value p.

The multiplier 102 multiplies the digital signals $x_i$ and $x_q$ with the distortion compensation coefficient h and feeds the results of multiplication to digital-to-analog converters (hereinafter referred to as DACs) 103i and 103q, respectively. The DACs 103i and 103q convert input digital signals into analog signals and feed the analog signals to a modulation/amplification unit 104.

The modulation/amplification unit 104 quadrature modulates the input analog signals and converts the base band signals into radio frequency (RF) band signals. The modulation/amplification unit 104 then amplifies the RF band signals for the output from an output terminal $S_o$. Upon this amplification in the modulation/amplification unit 104, the signals may suffer any distortions (amplitude distortions and phase distortions) by the amplifier.

An attenuation/demodulation unit 105 also receives the transmission signals in the form of feedback signals. The attenuation/demodulation unit 105 attenuates signals amplified by the modulation/amplification unit 104, into signals having a pre-amplified power. The attenuation/demodulation unit 105 then quadrature demodulates them and converts RF band signals into base band signals. The signals converted by the attenuation/demodulation unit 105 are fed to analog-to-digital converter (hereinafter referred to as ADCs) 106i and 106q, for the conversion into digital signals.

The digital signals are fed to a distortion compensation coefficient update unit 108 and to one input terminals of subtractors 107i and 107q. The other input terminals of the subtractors 107i and 107q receive digital signals $x_i$ and $x_q$, respectively, from the input terminals $S_i$ and $S_q$, respectively. The subtractors 107i and 107q find difference (i.e., distortion upon the amplification in the modulation/amplification unit 104) signals between the digital signals $x_i$, $x_q$ and output signals of the ADCs 106i, 106q, respectively, and feed the difference signals (error signals) to the distortion compensation coefficient update unit 108.

The distortion compensation coefficient update unit 108 finds a new distortion compensation coefficient h' based on output signals of the ADCs 106i, 106q, output signals of the subtractors 107i, 107q and distortion compensation coefficient h from the distortion compensation coefficient storage unit 101. The unit 108 then updates the distortion compensation coefficient storage unit 101 by use of the new distortion compensation coefficient h'. This updated distortion compensation coefficient h' is utilized for the subsequent input signal distortion compensations.

The above processings are iterated for each digital signal input.

In such a conventional transmitter, however, the feedback signals are converted by the ADCs 106i and 106q into digital signals. As described above, these feedback signals are obtained by subjecting the input signals to distortions upon the amplification and have the same level of amplitude value as the input signals. Due to the necessity to represent not merely the input signals but also the distortions, therefore, the ADCs 106i and 106q must have a high bit precision (i.e., a large bit number) and, because of the input signal handling, a high operation frequency. Accordingly as the input signals have a higher input bit rate, the conversion processing may possibly become too late. In the event that the input signals have an extremely large amplitude value and a high frequency as in the case of the CDMA system base station, this deficiency will become more prominent.

SUMMARY OF THE INVENTION

The present invention was conceived in view of such a situation. It is therefore an object of the present invention to provide a distortion compensating apparatus and a distortion compensating method which allow use of ADCs having a relatively low bit precision and having a relatively low operation frequency.

In order to achieve the above object there is provided a distortion compensating apparatus of the present invention for compensating distortions of an amplifier arranged to amplify analog signals converted from digital input signals, the distortion compensating apparatus converting the digital input signals into analog signals, the distortion compensating apparatus finding, in the analog region, distortion components of the amplifier from differences between the analog input signals and the analog output signals of the amplifier, the distortion compensating apparatus converting the distortion components into digital signals to thereby determine distortion compensation coefficients.

As a result, an analog-to-digital converter of the present invention handling only the distortion components for the conversion of analog signals into digital signals can be one having a lower bit precision and a relatively lower operation frequency than those of the conventional analog-to-digital converter for converting analog output signals from the amplifier into digital signals.

According to a first aspect of the present invention there is provided a distortion compensating apparatus for compensating distortions of an amplifier arranged to amplify analog signals converted from digital input signals, the distortion compensating apparatus comprising a distortion compensation coefficient application unit which holds distortion compensation coefficients for compensation of distortions of the amplifier, the distortion compensation coefficient application unit applying the held distortion compensation coefficients to the digital input signals; a first digital-to-analog converter which converts digital signals output from the distortion compensation coefficient application unit into analog signals, the first digital-to-analog converter providing the analog signals as its output to the amplifier; a first attenuator which attenuates analog output signals from the amplifier to reciprocal times the ideal gain of the amplifier; a second digital-to-analog converter which converts the digital input signals into analog signals; a subtractor which finds differential signals between output signals from the second digital-to-analog converter and output signals from the first attenuator; an analog-to-digital converter which converts the differential signals into digital signals; and a distortion compensation coefficient arithmetic unit which figures out new distortion compensation coefficients based on output signals from the analog-to-digital converter, the distortion compensation coefficient arithmetic unit using the new distortion compensation coefficients to update distortion compensation coefficients held by the distortion compensation coefficient application unit.

According to a second aspect of the present invention there is provided a distortion compensating apparatus for compensating distortions of an amplifier, comprising a first arithmetic circuit which effects in an analog region an arithmetic for obtaining distortion components of the amplifier from the differences between digital region signals associated with the input of the amplifier and analog region signals associated with the output of the amplifier; and a second arithmetic circuit which effects in a digital region an arithmetic of the distortion compensation coefficient for canceling distortion components, the distortion compensation coefficient being fed to input signals of the amplifier depending on the magnitudes of the distortion components.

According to a third aspect of the present invention there is provided a distortion compensating method for compensating distortions of an amplifier, the method comprising the steps of effecting in an analog region an arithmetic for obtaining distortion components of the amplifier from the differences between digital region signals associated with the input of the amplifier and analog region signals associated with the output of the amplifier; and effecting in a digital region an arithmetic of distortion compensation coefficients for canceling distortion components, the distortion compensation coefficient being fed to input signals of the amplifier depending on the magnitudes of the distortion components.

The distortion compensation coefficient application unit preferably includes a power calculation unit which calculates powers of the digital input signals; a distortion compensation coefficient storage unit which holds distortion compensation coefficients corresponding to power values of the digital input signals, the distortion compensation coefficient storage unit providing as its output distortion compensation coefficients corresponding to power values calculated by the power calculation unit; and a multiplier which multiplies the digital input signals by distortion compensation coefficients output from the distortion compensation coefficient storage unit.

The distortion compensating apparatus may further comprise a variable gain amplifier disposed between the subtractor and the analog-to-digital converter, the variable gain amplifier accepting the differential signals, the variable gain amplifier amplifying the differential signals by a variable gain to impart the amplified differential signals to the analog-to-digital converter; a second attenuator disposed between the analog-to-digital converter and the distortion compensation coefficient arithmetic unit, the second attenuator variably attenuating output signals of the analog-to-digital converter with an attenuation factor equal to the reciprocal of the gain of the variable gain amplifier; a control unit which provides a control of the gain of the variable gain amplifier and the attenuation factor of the second attenuator depending on the magnitude of the amplitudes or powers of the differential signals; a first switch which changes over signals fed to the analog-to-digital converter to either the differential signals or output signals of the variable gain amplifier; a second switch which effects a changeover such that the distortion compensation coefficient arithmetic unit receives either output signals of the analog-to-digital converter or output signals of the second attenuator; and a switch control unit which provides a control of the first switch and the second switch on the basis of absolute values of amplitudes of the differential signals, the switch control unit when the first switch is switched to the differential signals, changing over the second switch to the analog-to-digital converter, the switch control unit when the first switch is switched to the variable gain amplifier, changing over the second switch to the second attenuator.

BRIEF DESCRIPTION OF THE DRAWINGS

The above and other objects, aspects, features and advantages of the present invention will become more apparent from the following detailed description when taken in conjunction with the accompanying drawings, in which:

FIG. 3 depicts a table showing the relationship between an input signal and an output signal of a selector which makes up the phase rotator;

DESCRIPTION OF THE PREFERRED EMBODIMENTS

<First Embodiment>

Figure 1:
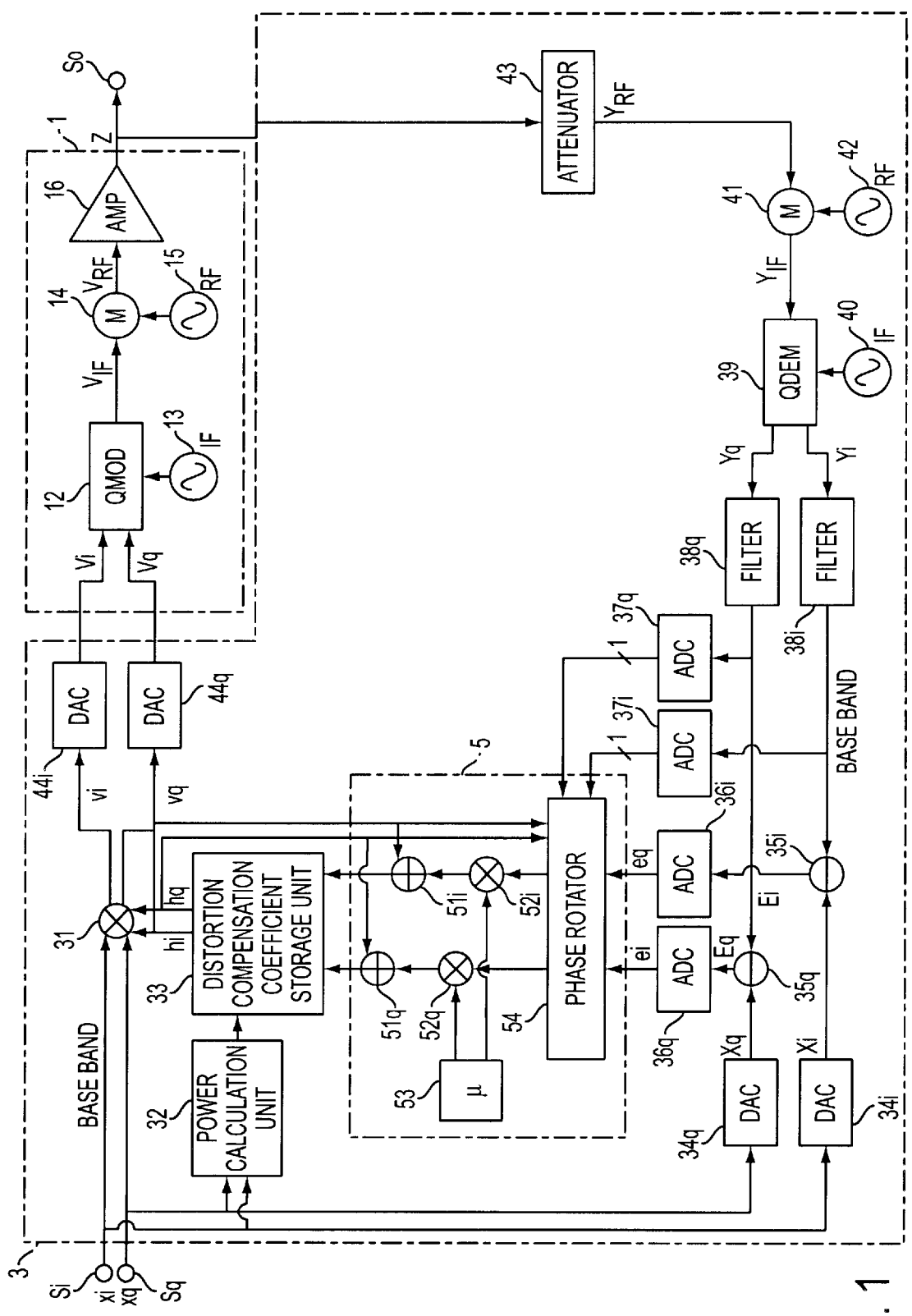
FIG. 1 is a block diagram showing the configuration of a transmitter provided with an adaptive predistortor type distortion compensation unit which is an example of the distortion compensating apparatus in accordance with a first embodiment of the present invention.

FIG. 1 is a block diagram showing the configuration of a transmitter provided with an adaptive predistortor type distortion compensation unit 3 which is an example of the distortion compensating apparatus in accordance with a first embodiment of the present invention.

The transmitter comprises input terminals $S_i$ and $S_q$ for receiving digital signals, a modulation/amplification unit 1 which modulates and amplifies the input digital signals for output, the compensation unit 3 carrying out an adaptive predistortor type distortion compensation, and an output terminal $S_O$ for providing radio frequency (RF) analog signals as its output.

Base band digital input signals x(n) (n represents time) are separately received through the input terminals $S_i$ and $S_q$ in the form of Ich digital I signal $x_i(n)$ and Qch digital Q signal $x_q(n)$, respectively. That is, the relationship between x(n) and $x_i(n)$ and $x_q(n)$ can be given using a complex number j as the following equation (1).

$$x(n)=x_i(n)+j\cdot x_q(n) \qquad (1)$$

These digital I signal $x_i(n)$ and digital Q signal $x_q(n)$ are fed to the distortion compensation unit 3 and subjected to predistortion.

Hereinafter, in order to distinguish the digital signals from the analog signals, the digital signals are denoted by small letters whereas the analog signals are denoted by capital letters.

In the distortion compensation unit 3, as will be described later, a multiplier (e.g., shift register, FPGA (field programmable gate array), etc.) 31 multiplies an input signal x(n) with a distortion compensation coefficient h(p) (p is a power value of the input signal x(n)). The distortion compensation unit 3 converts the adapted signals (hereinafter referred to as digital signals v(n) consisting of a digital signal I signal $v_i(n)$ and a digital Q signal $v_q(n)$) into an analog I signal $V_i(t)$ ("t" is time corresponding to "n") and an analog Q signal $V_q(t)$, respectively, for impartment to the modulation/amplification unit 1.

The modulation/amplification unit 1 comprises a quadrature modulator 12, local oscillators 13, 15, a mixer 14 and an amplifier 16.

The analog I signal $V_i(t)$ and analog Q signal $V_q(t)$ from the distortion compensation unit 3 are fed to the quadrature modulator 12. The quadrature modulator 12 receives an oscillatory output of the local oscillator 13. The local oscillator 13 provides the quadrature modulator 12 with a frequency required to convert the base band signals into intermediate frequency (IF) band signals. As a result, the quadrature modulator 12 subjects the analog I signal $V_i(t)$ and analog Q signal $V_q(t)$ to quadrature modulations and provides quadrature-modulated signals as its outputs in the form of intermediate frequency band analog signals (intermediate frequency analog signals) $V_{IF}(t)$.

The intermediate frequency analog signals $V_{IF}(t)$ output from the quadrature modulator 12 are fed to the mixer 14. The mixer 14 receives an oscillatory output of the local oscillator 15. The local oscillator 15 provides the mixer 14 with a frequency required to convert the intermediate frequency band signals into radio frequency (RF) band signals. As a result, the mixer 14 converts the input intermediate frequency analog signals $V_{IF}(t)$ into radio frequency band analog signals (radio frequency analog signals) $V_{RF}(t)$ for output.

The radio frequency analog signals from the mixer 14 are fed for amplification to the amplifier 16 and thereafter output (transmitted) through an output terminal $S_o$.

Assume herein that the amplifier 16 has a gain (amplification factor) A upon the linear operations but has an amplitude nonlinear distortion g(p) and a phase quantity-of-rotation q(p) upon the nonlinear operations. Thus, let Z(t) be a signal output from the output terminal $S_o$, then Z(t) is represented as the following equation (2).

$$Z(t)=A\cdot g(p)\cdot exp(j\cdot q(p))\cdot V_{RF}(t) \qquad (2)$$

In this embodiment, "gain" means the ratio of the output power to the input power unless otherwise specified, and the logarithmic representation of this ratio will be specifically notified as being logarithmically represented. The same applies to the "attenuation rate".

The distortion compensation unit 3 comprises a multiplier 31, a power calculation unit 32, a distortion compensation coefficient storage unit 33, digital-to-analog converters (hereinafter referred to as DACs) 34i, 34q, subtractors 35i, 35q, analog-to-digital converters (hereinafter referred to as ADCs) 36i, 36q, 1-bit ADCs 37i and 37q, filters 38i, 38q, a quadrature demodulator 39, a local oscillator 40, a mixer 41, a local oscillator 42, an attenuator 43, a distortion compensation coefficient arithmetic unit 5 and DACs 44i, 44q.

Herein, the sign i of the reference numeral 34i denotes I signal processing, whilst the sign q of the reference numeral 34q means Q signal processing. The same applies to the other reference numerals.

The digital signals x(n) (i.e., the digital I signal $x_i(n)$ and the digital Q signal $x_q(n)$) input to the distortion compensation unit 3 are fed to the multiplier 31 and simultaneously to both the power calculation unit 32 and the DACs 34i, 34q.

The power calculation unit 32 figures out a power value $p(=x_i^2(n)+x_q^2(n))$ of the input digital signal x(n) and feeds the calculated power value p to the distortion compensation coefficient storage unit 33.

The distortion compensation coefficient storage unit 33 is configured as e.g., a memory which is accessed with the power value p as the address (or index). A memory cell corresponding to each address holds a distortion compensation coefficient h(p) (digital value) corresponding to the power value p associated with that address. Each distortion compensation coefficient consists of an I signal corresponding distortion compensation coefficient $h_i(p)$ and a Q signal corresponding distortion compensation coefficient $h_q(p)$. That is, $$h(p)=h_i(p)+j \cdot h_q(p) \quad (3)$$

When receiving a power value p(n) from the power calculation unit 32, the distortion compensation coefficient storage unit 33 provides as its output to the multiplier 31 and the distortion compensation coefficient arithmetic unit 5 which will be described later distortion compensation coefficients {$h_i(p)$, $h_q(p)$} (hereinafter expressed simply as {$h_i$, $h_q$}) held in the memory cell having the address of this power value p.

As will be discussed in detail later, the distortion compensation coefficient h(p)={$h_i$, $h_q$} of the memory cell corresponding to the address p is updated (replaced) by a new distortion compensation coefficient h'(p)={$h_i'$, $h_q'$} acquired by the distortion compensation coefficient arithmetic unit 5 (described later). To hold the power value p as the address till this update, the distortion compensation coefficient storage unit 33 is provided with a hold circuit (e.g., a latch, not shown) for holding the power value p during a certain period. This hold circuit is configured such that it holds the power value p until the distortion compensation coefficient arithmetic unit 5 figures out the distortion compensation coefficient h'(p) for the digital input signal x(n) and updates the distortion compensation coefficient h(p) of the distortion compensation coefficient storage unit 32 on the basis of the calculated distortion compensation coefficient h'(p).

Thus, even if prior to completion of the updating the power calculation unit 32 receives a digital signal x(n+1) at the next time (n+1) so that the power value p' is fed to the distortion compensation coefficient storage unit 33, the distortion compensation coefficient h(p) of the distortion compensation coefficient storage unit 33 can be updated by the new coefficient h'(p). It is natural that after the completion of the updating this hold circuit holds the new address p'.

The multiplier 31 multiplies an input digital I signal $x_i(n)$ and digital Q signal $x_q(n)$ with distortion compensation coefficients {$h_i$, $h_q$} to generate output signals $v_i(n)$ and $v_q(n)$. Herein, the output signals $v_i(n)$ and $v_q(n)$ are given as $$v_i(n)=h_i \cdot x_i(n)-h_q \cdot x_q(n) \quad (4)$$

$$v_q(n)=h_q \cdot x_i(n)+h_i \cdot x_q(n) \quad (5)$$

A digital I signal $v_i(n)$ and a digital Q signal $v_q(n)$ are fed to the DACs 44i and 44q, respectively, for the conversion into an analog I signal $V_i(t)$ and an analog Q signal $V_q(t)$, respectively. The analog I signal $V_i(t)$ and the analog Q signal $V_q(t)$ are fed to the quadrature modulator 12 which has been described earlier.

On the other hand, a radio frequency analog signal Z(t) output from the amplifier 16 are fed as a feedback signal also to the attenuator 43 of the distortion compensation unit 3.

The attenuator 43 has a linearity and attenuates the input signal without causing any distortion by an attenuation rate 1/A which is reciprocal times the gain A of the amplifier 16 upon the linear operations.

That is, let $Y_{RF}(t)$ be the radio frequency analog signal output from the attenuator 43, then from the expression (2)

$$Y_{RF}(t) = Z(t)/A \quad (6)$$

$$= g(p) \cdot e^{j \cdot q(p)} \cdot V_{RF}(t)$$

results.

This analog output signal Y(t) is fed to the mixer 41. The mixer 41 receives an oscillatory output signal of the local oscillator 42. The local oscillator 42 imparts to the mixer 41 a frequency required to convert the RF band signals into IF band signals. Thus, the mixer 41 performs the reverse processing to that of the mixer 14 described above, i.e., converts the input radio frequency analog signal $Y_{RF}(t)$ into the intermediate frequency analog signal $Y_{IF}(t)$, which in turn is fed to the quadrature demodulator 39.

The quadrature demodulator 39 receives an oscillatory output signal of the local oscillator 40. The local oscillator 40 imparts to the quadrature demodulator 39 a frequency required to convert the IF band signals into base band signals. Thus, the quadrature demodulator 39 performs the reverse processing to that of the quadrature modulator 12 described above, i.e., converts intermediate frequency analog signals $Y_{IF}(t)$ into base band signals Y(t) and subjects the base band signals to a quadrature demodulation for the output as an analog I signal $Y_i(t)$ and an analog Q signal $Y_q(t)$.

The thus output analog signals $Y_i(t)$ and $Y_q(t)$ are fed to the filters 38i and 38q, respectively. The filters 38i and 38q filtrate signal components of high frequencies generated by the demodulation and permit only the base band signals to pass therethrough. After the passage through the filters 38i and 38q, the base band analog signals $Y_i(t)$ and $Y_q(t)$ are fed to one input terminals of the subtractors (e.g., 180 degree hybrid combiner) 35i and 35q, respectively, and simultaneously to the 1-bit ADCs 37i and 37q, respectively.

The other input terminals of the subtractors 35i and 35q receive as reference signals analog input signals $X_i(t)$ and $X_q(t)$ which are converted into analog signals by the DACs 34i and 34q.

The subtractors 35i and 35q find and issue differential signals (analog error signals) $E_i(t)$ and $E_q(t)$ between the base band analog output signals (feedback signals) $Y_i(t)$ and $Y_q(t)$ fed to the respective one input terminals and the analog input signals (reference signals) $X_i(t)$ and $X_q(t)$ fed to the respective other input terminals. That is, $$E_i(t)=X_i(t)-Y_i(t) \quad (7)$$

$$E_q(t)=X_q(t)-Y_q(t) \quad (8)$$

are obtained.

Because of being processed by the attenuator 43, mixer 41, quadrature demodulator 39 and filters 38i and 38q, the base band analog signals $Y_i(t)$ and $Y_q(t)$ have errors arising from the distortion (amplitude distortion g(p) and phase distortion $e^{j \cdot q(p)}$) components of the amplifier 16 relative to the analog signals $V_i(t)$ and $V_q(t)$. Thus, the analog error signals $E_i(t)$ and $E_q(t)$ represent the distortion component based errors.

The analog error signals $E_i(t)$ and $E_q(t)$ are fed to the ADCs 36i and 36q, respectively, for the conversion into digital error signals $e_i(n)$ and $e_q(n)$, respectively. Herein, input analog error signals $E_i(t)$ and $E_q(t)$ represent errors based on the distortion components of the amplifier 16, and hence they have smaller dynamic ranges and slower variations than the base band analog signals $Y_i(t)$ and $Y_q(t)$. Thus, the ADCs 36i and 36q for converting the analog error signals $E_i(t)$ and $E_q(t)$ can be ones having a lower bit precision (i.e., a smaller bit number) and a lower operation frequency than the conventional ADCs for the conversion of the base band analog signals $Y_i(t)$ and $Y_q(t)$. This allows the use of inexpensive ADCs and is advantageous in costs.

The digital error signals $e_i(n)$ and $e_q(n)$ are fed to the distortion compensation coefficient arithmetic unit 5 (a phase rotator 54).

On the other hand, the 1-bit ADCs 37i and 37q convert into digital signals only sign bit (e.g., MSB) parts consisting of 1 bit, of the base band analog signals $Y_i(t)$ and $Y_q(t)$ and feed the sign bits to the distortion compensation coefficient arithmetic unit 5 (the phase rotator 54). These 1-bit ADCs 37i and 37q serve to convert only one-bits of the analog input signals into digital signals and allow the use of inexpensive ones having a lower bit precision.

The distortion compensation coefficient arithmetic unit 5 figures out a new distortion compensation coefficient h'(p) based on the digital error signals $e_i(n)$ and $e_q(n)$ and on the sign bits from the 1-bit ADCs 37i and 37q.

The distortion compensation coefficient arithmetic unit 5 of this embodiment employs, as an example of the arithmetic for finding the new distortion compensation coefficient, a clipped LMS algorithm in which the complex number multiplication is limited to the phase rotations of rotational angles 0, $\pi/2$, $\pi$, and $3\pi/2$ [rad], out of the least mean square (LMS) algorithms. The distortion compensation coefficient arithmetic unit 5 includes adders 51i and 51q, multipliers 52i and 52q, a step size hold unit 53, and the phase rotator 54.

The phase rotator 54 receives the digital error signals $e_i(n)$ and $e_q(n)$ from the ADCs 36i and 36q, signals indicative of sign bits from the 1-bit ADCs 37i and 37q, and signals indicative of distortion compensation coefficients $\{h_i, h_q\}$ from the distortion compensation coefficient storage unit 33.

Figure 2:
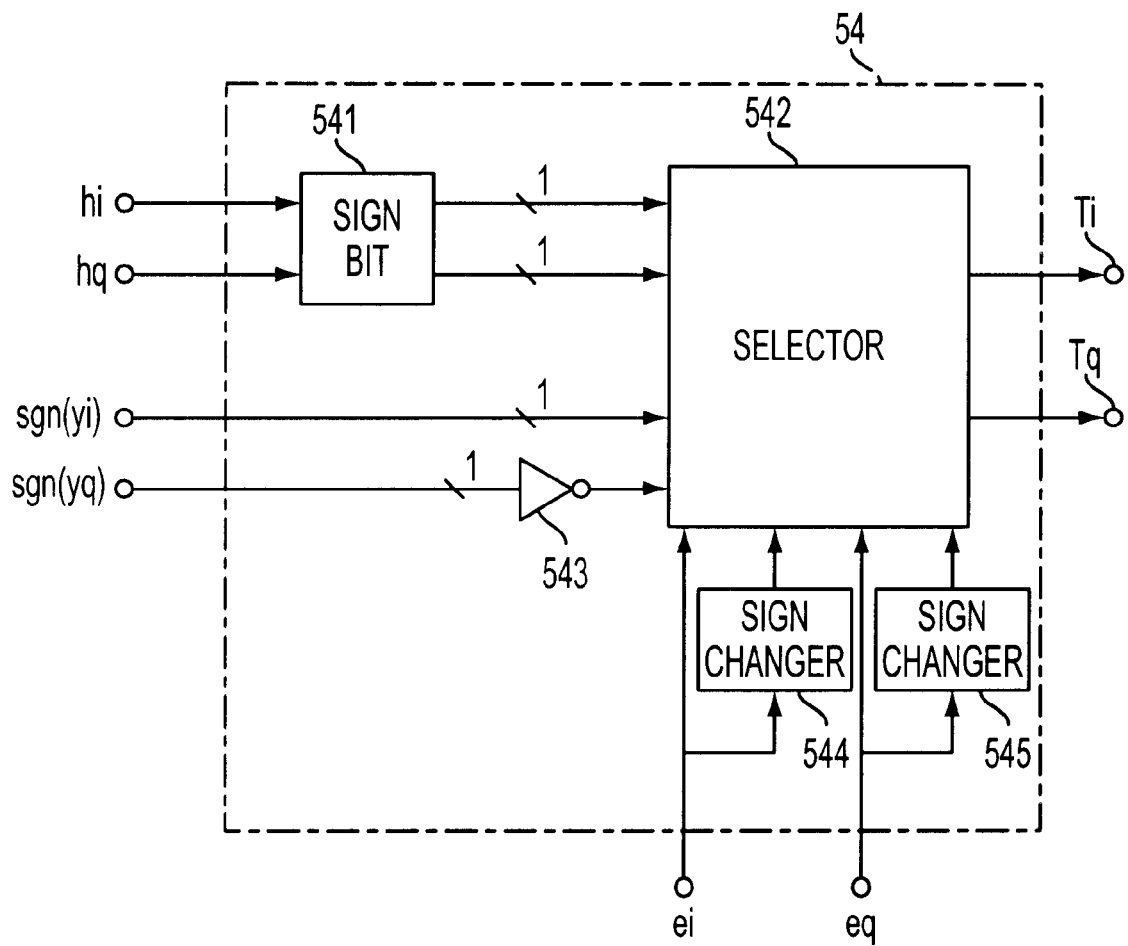
FIG. 2 is a block diagram showing the detailed configuration of a phase rotator.

FIG. 2 is a block diagram showing the detailed configuration of the phase rotator 54. FIG. 3 depicts a table showing the relationship between an input signal and an output signal of a selector 542 which makes up the phase rotator 54.

The phase rotator 54 comprises a sign bit outputting unit 541, the selector 542, an inverter 543, and sign changers 544 and 545.

The sign bit outputting unit 541 receives the distortion compensation coefficients $\{h_i, h_q\}$ fed from the distortion compensation coefficient storage unit 33 into the phase rotator 54. The sign bit outputting unit 541 selects and outputs the sign bits (e.g., MSB) of the input digital signals. Thus, signs of the distortion compensation coefficients $h_i$ and $h_q$ are output from the sign bit outputting unit 541 and fed to the selector 542.

The selector 542 receives a sign bit sgn ($y_i$) input from the 1-bit ADC 37i into the phase rotator 54. A sign bit sgn ($y_q$) input from the 1-bit ADC 37q into the phase rotator 54 is 0–1 inverted by the inverter 543 and thereafter fed to the selector 542.

Digital error signals $e_i(n)$ and $e_q(n)$ input from the ADCs 36i and 36q into the phase rotator 54 are fed to the selector 542 and to the sign changer 545. The sign changers 544 and 545 serve to change the signs of the input signals for the output. Therefore, the sign changer 544 provides as its output a digital error signal $-e_i(n)$ whose sign has been changed whereas the sign changer 545 provides as its output a digital error signal $-e_q(n)$ whose sign has been changed, both the resultant signals being fed to the selector 542.

From the input signs of $h_i$ and $h_q$, and from sgn ($y_i(n)$) and sgn ($y_q(n)$), depending on the table of FIG. 3 the selector 542 selects either the input digital error signal $e_i(n)$ or $-e_i(n)$ and either the input digital error signal $e_q(n)$ or $-e_q(n)$. The selector 542 then provides one of the selected signals as its output to the output terminal $T_i$ and the other to the output terminal $T_q$. These signals output from the output terminals $T_i$ and $T_q$ conform to signals obtained by rotating the input digital error signals $e_i(n)$ and $e_q(n)$ by the angle indicated as the "rotational angle" in FIG. 3 table.

The output signals of the selector 542 result in output signals of the phase rotator 54 so that the signal from the output terminal $T_i$ is fed to the multiplier 52i of FIG. 1 and that the signal from the output terminal $T_q$ is fed to the multiplier 52q of FIG. 1.

Referring back to FIG. 1, the multipliers 52i and 52q receive a step size $\mu$ (constant) held by the step size hold unit 53. The step size $\mu$ can be proper in the clipped LMS algorithm and is held in advance in the step size hold unit 53.

As a result, the digital error signals from the phase rotator 54 are multiplied by $\mu$ and fed to the adders 51i and 51q. The adders 51i and 51q receive distortion compensation coefficients $\{h_i, h_q\}$ referenced by the distortion compensation coefficient storage unit 33. Hence, the new distortion compensation coefficient h'(p) is given as $$h'(p)=h(p)+\mu \cdot e(n)det[h(p)]det[y(n)^*] \quad (9)$$

Herein, det[h(p)] det[y(n)*] represents the rotational angle imparted by the phase rotator 54. From the table shown in FIG. 3,
in the case of the rotational angle 0, $$e(n)det[h(p)]det[y(n)^*]=e_i(n)+je_q(n)$$

in the case of the rotational angle $\pi/2$, $$e(n)det[h(p)]det[y(n)^*]=-e_q(n)+je_i(n)$$

in the case of the rotational angle $\pi$, $$e(n)det[h(p)]det[y(n)^*]=-e_i(n)-je_q(n)$$

and, in the case of the rotational angle $3\pi/2$, $$e(n)det[h(p)]det[y(n)^*]=e_q(n)-je_i(n)$$

The real part and imaginary part of the thus obtained new distortion compensation coefficient h'(p) result in $h_i'$ and $h_q'$, respectively.

The value of the memory cell having the power value p as the address is thus rewritten (updated) as this new distortion compensation value h'(p)=$\{h_i', h_q'\}$. Then, when the distortion compensation coefficient storage unit 33 is accessed by the same power value p at the time (n+1) or later, the new distortion compensation value h' is referenced for the output to the multiplier 31.

The above processings are carried out for each of the digital input signals.

This embodiment needs the DACs 34i and 34q for converting the digital input signals $x_i(n)$ and $x_q(n)$ into analog signals, although there will suffice those DACs 34i and 34q having a lower bit precision than the conventional ADCs for converting the analog output signals from the amplifier into digital signals since the digital input signals $x_i(n)$ and $x_q(n)$ contain no distortion components. The same will apply to the other embodiments which will be described hereinbelow.

<Second Embodiment>

In the first embodiment, the analog error signals have been acquired in the base band and converted by the ADCs into digital signals, but instead the analog error signals may be acquired in the intermediate frequency band and converted by the ADCs into the digital signals. In a second embodiment, the analog error signals are acquired in the intermediate frequency band and converted by the ADCs into the digital signals.

Figure 4:
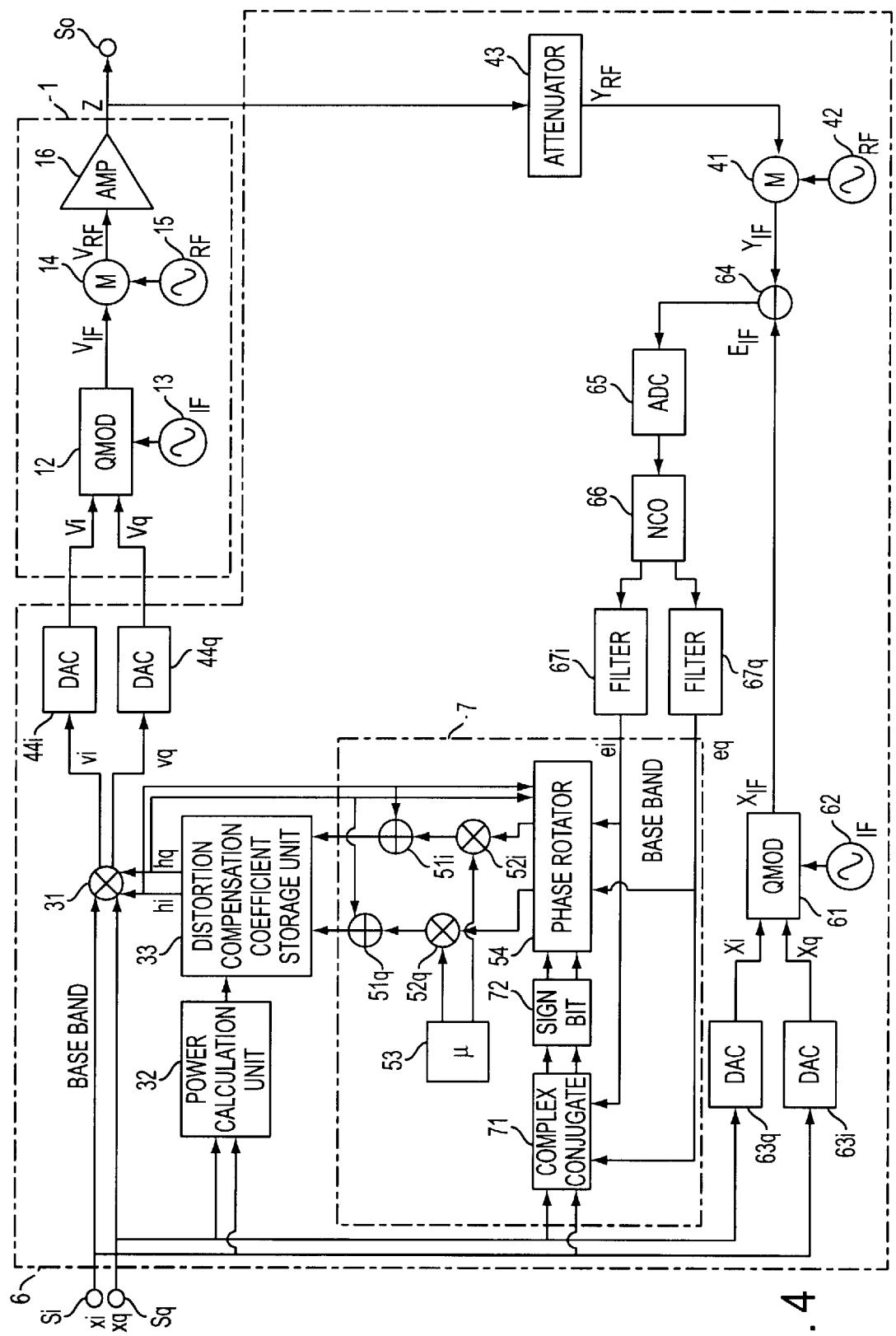
FIG. 4 is a block diagram showing the configuration of a transmitter provided with an adaptive predistortor type distortion compensation unit which is an example of the distortion compensating apparatus in accordance with a second embodiment of the present invention.

FIG. 4 is a block diagram showing the configuration of a transmitter provided with an adaptive predistortor type distortion compensation unit 6 which is an example of the distortion compensating apparatus in accordance with the second embodiment of the present invention. The same constituent elements as those in the first embodiment are designated by the same reference numerals and will not be again described in detail.

The transmitter comprises the modulation/amplification unit 1 having the same configuration as that of the first embodiment, and a distortion compensation unit 6 which is partly different in configuration from the distortion compensation unit 3 of the first embodiment. The difference of the distortion compensation unit 6 from the distortion compensation unit 3 lies in that the distortion compensation unit 3 finds the error signals by the base band signals whereas the distortion compensation unit 6 finds the error signals in the intermediate frequency band, the error signals being thereafter converted into base band signals for the acquisition of the distortion compensation coefficients.

To this end, in addition to the power calculation unit 32, the distortion compensation coefficient storage unit 33, the mixer 41, the local oscillator 42, the attenuator 43, and DACs 44$i$ and 44$q$ which have the same configurations as those in the first embodiment, the distortion compensation unit 6 further comprises a quadrature modulator 61, a local oscillator 62, DACs 63$i$ and 63$q$, a subtractor (e.g., 180 degree hybrid combiner) 64, an ADC 65, a numerically controlled oscillator (NCO) 66, and filters 67$i$ and 67$q$.

Base band digital input signals $x_i(n)$ and $x_q(n)$ input from the input terminals $S_i$ and $S_q$, respectively, are fed to the multiplier 31 and respectively to the DACs 63$i$ and 63$q$. The DACs 63$i$ and 63$q$ converts the input base band digital input signals $x_i(n)$ and $x_q(n)$ into base band analog signals $X_i(t)$ and $X_q(t)$, respectively, and fed to the quadrature modulator 61. The quadrature modulator 61 receives an oscillatory output signal for converting the base band signals into intermediate frequency signals from the oscillator 62. The quadrature modulator 61 thus subjects the base band analog input signals $X_i(t)$ and $X_q(t)$ to quadrature modulation and converts them into intermediate frequency (IF) band signals (intermediate frequency analog signal $X_{IF}(t)$) for the output. The thus output intermediate frequency analog signal $X_{IF}(t)$ is fed as a reference signal to one input terminal of the subtractor 64.

On the other hand, the other input of the subtractor 64 receives an intermediate frequency analog signal $Y_{IF}(t)$ which is an output signal from the mixer 41.

The subtractor 64 finds an analog error signal $E_{IF}(t)$ which is an differential signal between the intermediate frequency analog signal $X_{IF}(t)$ as the reference signal and the intermediate frequency analog signal $Y_{IF}(t)$ as the feedback signal, and feeds the resultant analog error signal $E_{IF}(t)$ to the ADC 65. In this manner, the subtractor 64 acquires the differences between the intermediate frequency signals.

The ADC 65 converts the intermediate frequency analog error signal $E_{IF}(t)$ into an intermediate frequency digital error signal $e_{IF}(n)$ and feeds the digital error signal $e_{IF}(n)$ to the numerically controlled oscillator 66. Therefore, due to the conversion of the analog error signals $E_{IF}(t)$, in the same manner as the first embodiment the ADC 65 of the second embodiment can be one having a lower bit precision and a lower operation frequency than the ADC for the conversion of the intermediate frequency analog signals $Y_{IF}(t)$.

The numerically controlled oscillator 66 quadrature demodulates the input intermediate frequency digital error signals $e_{IF}(n)$ and converts them into base band signals for the output to the filters 67$i$ and 67$q$. The filters 67$i$ and 67$q$ filtrate the high frequency components to permit only the base band signals to pass therethrough. After the passage through the filters 67$i$ and 67$q$, the base band digital error signals e(n) are fed to the distortion compensation coefficient arithmetic unit 7.

In addition to the adders 51$i$ and 51$q$, the multiplier 52$i$ and 52$q$ and the step size hold unit 53 which are the same as those of the first embodiment, the distortion compensation coefficient arithmetic unit 7 further comprises a complex conjugate arithmetic unit 71 and a sign bit outputting unit 72.

The complex conjugate arithmetic unit 71 finds a conjugate complex number of the difference between the digital input signal x(n) and the digital error signal e(n) as indicated by an expression (10) below, and generates digital signals each representing the real part and the imaginary part of this conjugate complex number.

$$\{x(n)-e(n)\}^*=\{x_i(n)-e_i(n)\}-j\{x_q(n)-e_q(n)\} \qquad (10)$$

The digital signals each representing the real part and the imaginary part of the conjugate complex number are equivalent to the base band digital signals converted from the analog output signals $Y_i(t)$ and $Y_q(t)$ from the attenuator 43. Those digital signals each representing the real part and the imaginary part of the conjugate complex number are fed to the sign bit outputting unit 72.

The sign bit outputting unit 72 is the same as the sign bit outputting unit 541 (see FIG. 2) of the first embodiment described above and serves to provide input signal sign bits as its outputs. That is, the sign bit outputting unit 72 provides the sign bits of the given real part and the imaginary part as its outputs to the phase rotator 54.

Thereafter, in the same manner as the first embodiment, a new distortion compensation coefficient h'(n) is figured out to update the distortion compensation coefficient storage unit 33.

In such a configuration finding the error signals from the IF band signals as in this embodiment, the number of the ADCs and the DACs can be reduced as is apparent from FIG. 4.

<Third Embodiment>

In the distortion compensation unit 3 of the first embodiment and the distortion compensation unit 6 of the second embodiment, the distortion compensation coefficient updating is iterated so that accordingly as the distortion compensation coefficient advances toward the convergence (i.e., the distortion compensation coefficient comes closer to the optimum value), the analog error signal E has a smaller amplitude. The smaller amplitude of the analog error signal E will prevent the effective use of the dynamic range of the ADC for converting this signal into a digital signal and lower the precision of the error signal converted into the digital signal. This applies for example to the case where only the lower two bits of the 8-bit ADC are used for the representation of the digital error signals.

In such a case, the analog error signal E is variably amplified depending on the magnitude of the amplitude and fed to the ADC, whereby effective use of the ADC dynamic range is ensured.

Figure 5:
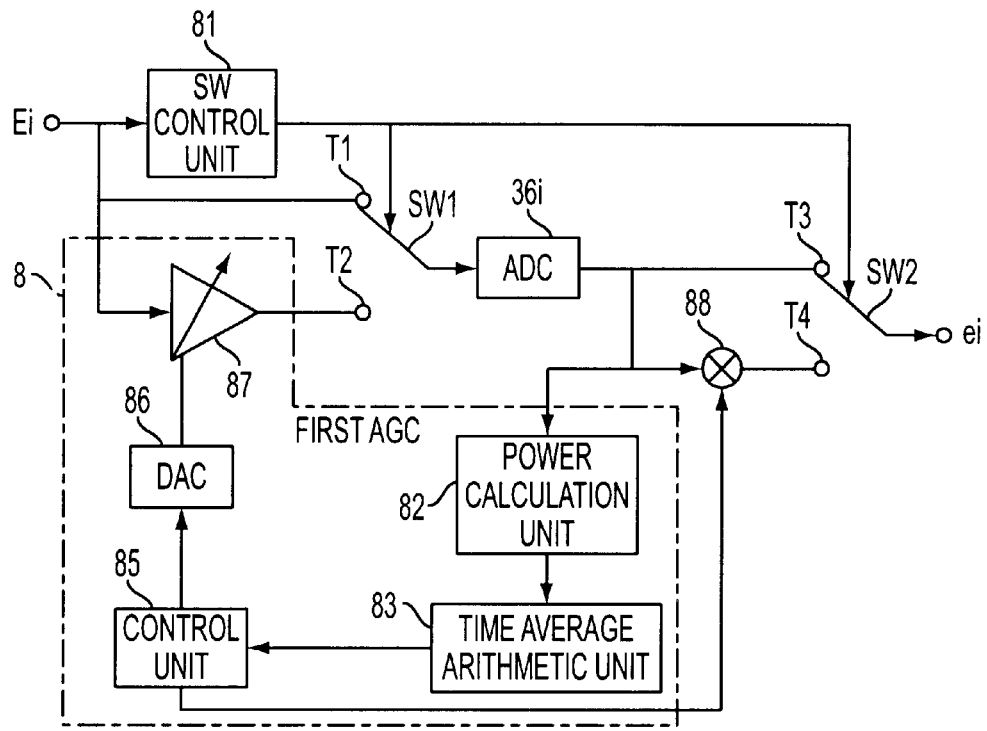
FIG. 5 is a block diagram showing the configuration of an error signal variably amplifying apparatus for variably amplifying analog error signals for the input to an ADC.

FIG. 5 is a block diagram showing the configuration of an error signal variably amplifying apparatus for variably amplifying the analog error signal for the input to the ADC. This error signal variably amplifying apparatus is applied to the ADC 36i of the first embodiment shown in FIG. 1 by way of example, although it may be applied to the other ADC 36q and to the ADC 65 of the second embodiment shown in FIG. 4.

The error signal variably amplifying apparatus is interposed between the subtractor 35i and the phase rotator 54. In addition to the ADC 36i, the error signal variably amplifying apparatus further comprises switches SW1 and SW2, a switch control unit 81 for providing a control of the switches SW1 and SW2, a first variable gain conversion circuit (hereinafter referred to as a first AGC) 8 and a multiplier 88. The first AGC 8 includes a power calculation unit 82, a time average arithmetic unit 83, a control unit 85, a DAC 86 and a gain variably amplifier 87.

The switch control unit 81 receives an analog error signal $E_i$ from the subtractor 35i (see FIG. 1). The switch control unit 81 has a preset first threshold value. The switch control unit 81 compares the first threshold value with the absolute value of the amplitude of the analog error signal $E_i$. The first threshold value is set to be equal to the absolute value of the amplitude of the analog error signal $E_i$ when the amplitude absolute value becomes smaller to such a degree as to prevent the effective use of the dynamic range of the ADC 36i. In the event that the ADC 36i has 8 output bits for example, the first threshold value is set to the amplitude absolute value $E_i$ upon use of only two bits of the eight bits when the analog error signal $E_i$ is converted into a digital signal.

When the amplitude absolute value of the analog error signal $E_i$ is larger than the first threshold value, the switch control unit 81 allows the switches SW1 and SW2 to be connected to the terminals T1 and T3, respectively. As a result, in the same manner as the first embodiment, the analog error signal $E_i$ is directly converted by the ADC 36i into a digital error signal $e_i$, which in turn is fed to the phase rotator 54 of FIG. 1.

On the contrary, when the amplitude absolute value of the analog error signal $E_i$ is equal to or less than the first threshold value, the switch control unit 81 allows the switches SW1 and SW2 to be connected to the terminals T2 and T4, respectively. As a result, the analog error signal $E_i$ is fed to the variable gain amplifier 87.

The changeover of the switches SW1 and SW2 by the switch control unit 81 may be effected for each half cycle or one cycle of the analog error signal $E_i$ or alternatively may be effected when all or the majority of analog error signals read for several cycles (e.g., several microseconds to several milliseconds) are larger (or not larger) than the first threshold value.

The initial value of the gain (amplification factor) of the variable gain amplifier 87 is set to 1 (i.e., 0 in logarithmic representation with no amplification and no attenuation), or alternatively to a value with which the analog error signal $E_i$ having the first threshold value as the amplitude value is amplified to a magnitude allowing the use of about 0.9 times the dynamic range of the ADC 36i.

Signals amplified by the variable gain amplifier 87 are converted into digital signals by the ADC 36i and fed to the power calculation unit 82 and to the multiplier 88. The power calculation unit 82 figures out a power value of the digital signal from the ADC 36i and feeds this power value to the time average arithmetic unit 83.

The time average arithmetic unit 83 stores a plurality of power values fed from the power calculation unit 82 for the predetermined duration and figures out the average value (time average value) of the plurality of power values stored. The thus obtained time average value is fed to the control unit 85. The "predetermined duration" is determined depending on the magnitude of the variation of the error signal $E_i$. When the variation is relatively large, it is set to a relatively short period of time whereas when the variation is relatively small, it may be set either to a relatively long period of time or a relatively short period of time. Specific values can be determined by simulations, experiments, etc.

The control unit 85 has a predetermined second threshold value stored in its internal memory or the like and compares the second threshold value with the time average value fed from the time average arithmetic unit 83. The second threshold value is set to a value allowing the time average value to converge (become asymptotic).

When the time average value is not less than the second threshold value, the control unit 85 sets the gain (amplification factor) of the variable gain amplifier 87 to a value less than the current value, whereas when the time average value is less than the second threshold value, it sets the gain of the variable gain amplifier 87 to a value larger than the current value. This setting is effected by converting the digital signal indicative of the gain by the DAC 86 into an analog signal and feeding this analog signal to the variable gain amplifier 87. The degree by which the gain is larger or smaller than the current value should be within the range prohibiting the output signals of the variable gain amplifier 87 from oscillating, and its specific values are obtained by simulations, experiments, etc.

With the gain fed by way of the DAC 86, the variable gain amplifier 87 amplifies the input analog error signals and feeds the thus amplified signals through the terminal T2 to the ADC 36i. As described hereinabove, the ADC 36i converts the input analog signals into digital signals and again feeds them to the power calculation unit 82 and to the multiplier 88.

By virtue of such a gain control of the variable gain amplifier 87, the time average value of the output signal power of the ADC 36i is controlled to converge to the second threshold value.

On the other hand, the control unit 85 imparts to the multiplier 88 a value (inverse of the gain of the variable gain amplifier: digital value) required to restore the analog error signal amplified by the variable gain amplifier 87 to its original magnitude. The multiplier 88 multiplies a value fed from the control unit 85 with the digital error signal input from the ADC 36i to restore the error signal amplified by the variable gain amplifier 87 to its original magnitude. That is, the multiplier 88 acts as a variable attenuator for variably attenuating the digital error signals with attenuation factors fed from the control unit 85. The digital error signal restored to its original magnitude is fed via the terminal T4 to the phase rotator 54 (see FIG. 1).

By feeding the thus amplified analog error signal $E_i$ to the ADC 36i in this manner, even the analog error signals having a less amplitude can be converted with an effective use of the dynamic range of the ADC 36i, and the precision of the digital error signals can be prevented from degrading.

The time average arithmetic unit 83 may be omitted. In such an event, the gain of the variable gain amplifier 87 is determined by the control unit 85 for each of the analog error signals $E_i(t)$. The variable gain amplifier 87 may be substituted by a variable attenuator.

<Fourth Embodiment>

Figure 6:
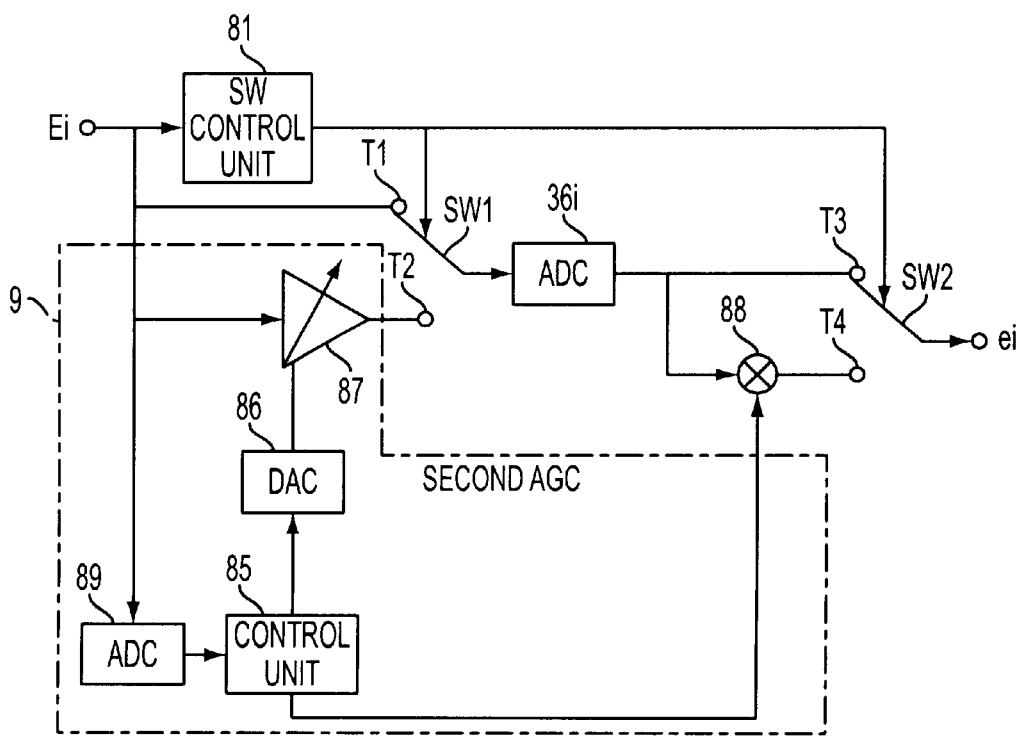
FIG. 6 is a block diagram showing another embodiment of the error signal variably amplifying apparatus.

FIG. 6 is a block diagram showing another embodiment of the error signal variably amplifying apparatus. This error signal variably amplifying apparatus also employs as the ADC the ADC 36i of the first embodiment by way of example, but instead it may use the other ADC 36q and the ADC 65 of the second embodiment. The same constituent elements of the error signal variably amplifying apparatus as those of the third embodiment shown in FIG. 5 are designated by the same reference numerals and will not be again described.

In addition to the ADC 36i, the error signal variably amplifying apparatus further has the switches SW1 and SW2, the switch control unit 81 for providing a control of the switches SW1 and SW2, a second variable gain conversion circuit (second AGC) 9 and the multiplier 88. The second AGC 9 is provided with the control unit 85, the DAC 86, the variable gain amplifier 87 and an ADC 89.

The ADC 89 is used for the conversion of smaller analog error signals $E_i$ in the process of convergence toward zero and hence can be one having a smaller bit number than the ADC 36i.

When the switch control unit 81 allows the switches SW1 and SW2 to be connected to the terminals T2 and T4, respectively, the ADC 89 converts the analog error signal $E_i$ into a digital error signal $e_i$ for the impartment to the control unit 85. The control unit 85 provides a control of the gain of the variable gain amplifier 87 by way of the DAC 86 so as to ensure an effective use of the dynamic range of the ADC 36i depending on the amplitude value of the digital error signal $e_i$ from the ADC 89. For example, the control unit 85 controls the gain of the variable gain amplifier 87 such that the signals amplified by the variable gain amplifier 87 lie within the 90% range of the dynamic range of the ADC 36i.

On the other hand, the control unit 85 imparts to the multiplier 88 an attenuation factor (inverse of the gain) corresponding to the gain of the variable gain amplifier 87, for the purpose of attenuating the signal amplified by the variable gain amplifier 87 to its original magnitude. The multiplier 88 multiplies the amplified error signal $e_i$ from the ADC 36i with this attenuation factor and feeds the result to the phase rotator 54 by way of the terminal T4.

By imparting the thus amplified analog error signal $E_i$ to the ADC 36i in this manner, even the analog error signals having a smaller amplitude can be converted with effective use of the dynamic range of the ADC 36i, and the precision of the digital error signals can be prevented from degrading.

<Fifth Embodiment>

Figure 7:
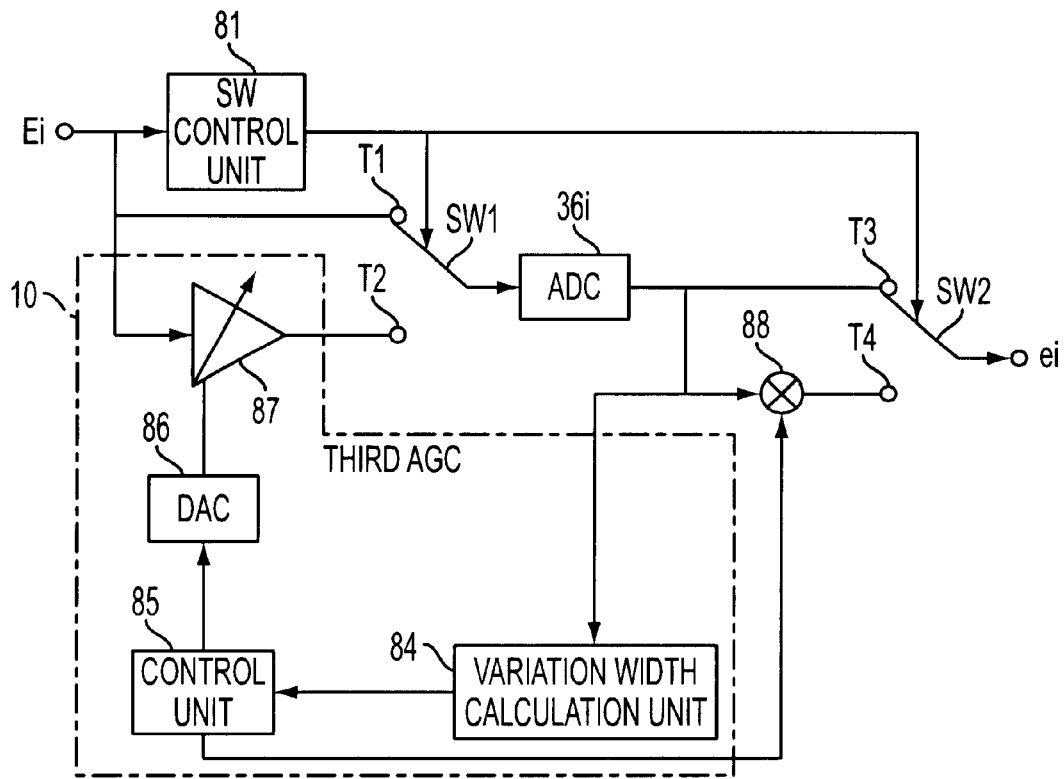
FIG. 7 is a block diagram showing a further embodiment of the error signal variably amplifying apparatus.

FIG. 7 is a block diagram showing a further embodiment of the error signal variably amplifying apparatus. This error signal variably amplifying apparatus also employs as the ADC the ADC 36i of the first embodiment, but may employ the other ADC 36q and the ADC 65 of the second embodiment. The same constituent elements of the error signal variably amplifying apparatus as those of the third embodiment shown in FIG. 5 are designated by the same reference numerals and will not be again described.

In addition to the ADC 36i, the error signal variably amplifying apparatus further includes the switches SW1 and SW2, the switch control unit 81 for providing a control of the switches SW1 and SW2, a third variable gain conversion circuit (third AGC) 10 and the multiplier 88. The third AGC 10 is provided with the control unit 85, the DAC 86, the variable gain amplifier 87 and a variation width calculation unit 84.

The variation width calculation unit 84 accumulates the digital signals from the ADC 36i for a certain period of time and, from the maximum value and minimum value of the thus accumulated digital signals, finds a variation width (=maximum value−minimum value) of the output signals of the ADC 36i. This variation width is fed to the control unit 85.

The control unit 85 compares the variation width with the input dynamic range of the ADC 36i and provides a control such that (a) when the variation width is not less than the input dynamic range, the gain of the variable gain amplifier 87 is a value smaller than the current value, but that (b) when the variation width is less than the input dynamic range, the gain of the variable gain amplifier 87 is a value larger than the current value. Herein, the degree by which the gain is increased or decreased is determined in the same manner as in the third embodiment described above.

This also ensures the effective use of the dynamic range of the ADC 36i for the conversion and prevention of any degradation of the digital error signal precision.

<Sixth Embodiment>

In the third to fifth embodiments, the attenuation of the error signals $e_i$ amplified by the variable gain amplifier 87 could be achieved by varying the step size $\mu$ (see FIGS. 1 and 4).

Figure 8:
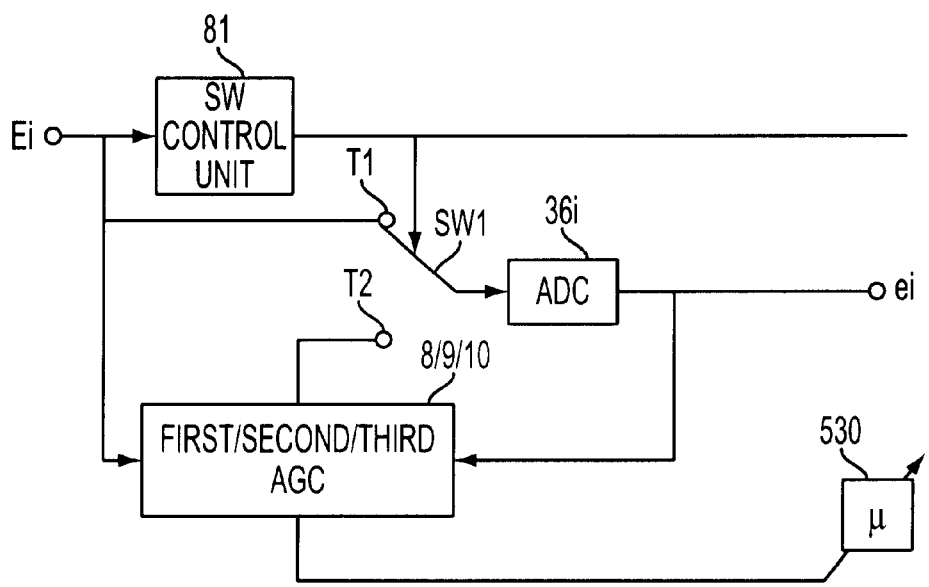
FIG. 8 is a block diagram showing the configuration of an error signal variably amplifying apparatus for varying the step size $\mu$.

FIG. 8 is a block diagram showing the configuration of an error signal variably amplifying apparatus for varying the step size $\mu$. This apparatus does not have the switch SW2 and the multiplier 88 of the error signal variably amplifying apparatus shown in FIGS. 5 to 7. On the other hand, the step size hold unit 53 shown in FIGS. 1 and 4 is substituted by a variable step size hold unit 530 capable of varying the step size $\mu$.

The switch control unit 81 provides a control of only the switch SW1. The control unit 85 included in the first AGC 8, the second AGC 9 or the third AGC 10 sets the step size $\mu$ corresponding to the attenuation factor in the variable step size hold unit 530. The variable step size hold unit 530 provides the set step size $\mu$ as its output to the multipliers 52i and 52q of FIG. 1 or 4. As a result, the multipliers 52i and 52q achieve substantial attenuations to obtain proper distortion compensation values.

In this embodiment as well, the analog error signals $E_i$ are amplified and fed to the ADC 36i whereby even the analog error signals having a smaller amplitude can be converted with effective use of the dynamic range of the ADC 36i and the digital error signal precision can be prevented from degrading.

<Seventh Embodiment>

In the third to sixth embodiments described hereinabove, the switch control unit 81 may be replaced by a timer to control the switches SW1 and SW2.

Figure 9:
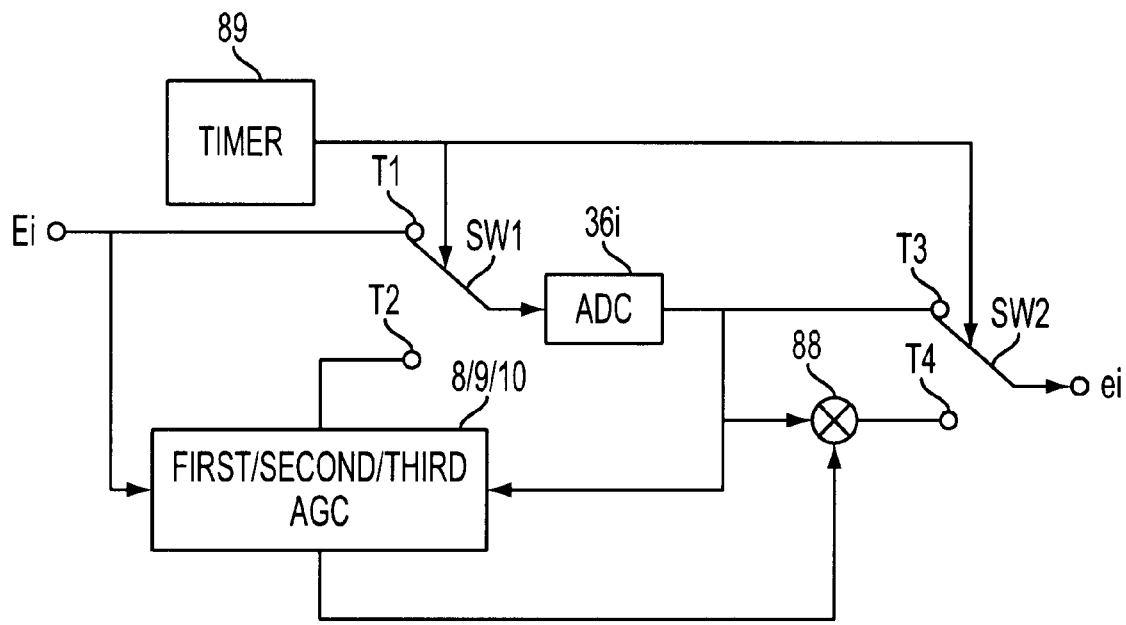
FIG. 9 is a block diagram showing the configuration of an error signal variably amplifying apparatus using a timer.

FIG. 9 is a block diagram showing the configuration of an error signal variably amplifying apparatus using a timer 89. This error signal variably amplifying apparatus differs from the error signal variably amplifying apparatuses depicted in FIGS. 5 to 8 in that the former employs the timer 89 in lieu of the switch control unit 81. The other configurations and constituent elements are the same as those of the error signal variably amplifying apparatuses shown in FIGS. 5 to 8. Therefore, the timer 89 will exclusively be described hereinbelow.

The timer 89 has therein set a time (hereinafter referred to as a changeover time) required for the amplitude absolute value of the analog error signal $E_i$ to become smaller than the preset value (e.g., the first threshold value set in the switch control unit 81) after the start of the distortion compensation. This changeover time is obtained by simulations, experiments, etc. Prior to the elapse of the changeover time the timer 89 allows the switches SW1 and SW2 to be connected to the terminals T1 and T3, respectively, whereas upon the elapse of the changeover time the timer 89 allows the switches SW1 and SW2 to be connected to the terminals T2 and T4, respectively. As a result, the analog error signals $E_i$ are amplified by the variable gain amplifier 87 upon the elapse of the changeover time and thereafter converted by the ADC 36i (see FIG. 5 or 6) into digital signals. In consequence, the effective use of the dynamic range of the ADC 36i is ensured and the error signal precision can be prevented from degrading.

<Eighth Embodiment>

The effective use of the ADC dynamic range may be achieved by use of the ADC capable of varying the input dynamic range, with the input dynamic range being adapted to the amplitude value of the input analog error signals.

Figure 10:
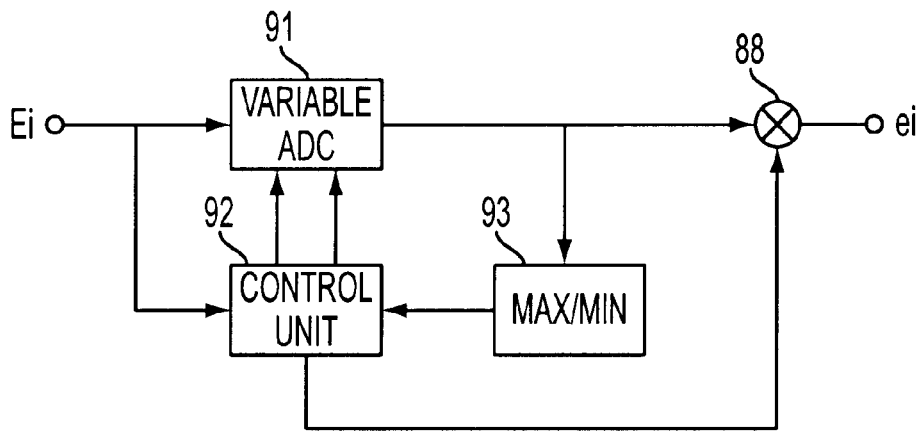
FIG. 10 is a block diagram showing the configuration of an error signal converting apparatus using a dynamic range variable ADC.

FIG. 10 is a block diagram showing the configuration of an error signal converting apparatus using an input dynamic range variable ADC (hereinafter referred to simply as a variable ADC). This error signal converting apparatus is interposed between the subtractors 35i, 35q and the phase rotator 54 in FIG. 1 but between the subtractor 64 and the NCO 66 in FIG. 4.

The error signal converting apparatus includes a variable ADC 91, a control unit 92 for providing a control of the input dynamic range of the variable ADC 91, and a MAX/MIN circuit 93 for detecting the maximum value and the minimum value of the output signals of the variable ADC 91.

Analog signals $E_i$ ($E_q$, E) from the subtractor 35i (35q, 64) are fed to the variable ADC 91 and to the control unit 92.

In addition to the analog error signal input terminal and the post-conversion digital error signal output terminal, the variable ADC 91 further has two voltage setting terminals for setting the input signal voltage maximum value $V_t$ and minimum value $V_b$. The voltage setting terminals are connected to the control unit 92 so that the voltage maximum value $V_t$ and minimum value $V_b$ are set by the control unit 92.

The MAX/MIN circuit 93 reads digital signals from the variable ADC 91 for a predetermined duration, to determine the maximum value $D_{MAX}$ and minimum value $D_{MIN}$ from the read digital signals for the output to the control unit 92. Herein, the "predetermined duration" for the digital signal reading is determined depending on the magnitude of the variations of the error signals $E_i$. When the variation is relatively large, it is set to a relatively short period of time, whereas when the variation is relatively small, it may be set to either a relatively long period of time or a relatively short period of time. The specific values are determined by simulations, experiments, etc.

The control unit 92 receives analog error signals $E_i$ ($E_q$, E) and has therein preset a threshold value similar to the first threshold value of the switch control unit 81 described hereinabove. The control unit 92 compares the first threshold value with the amplitude absolute value of the analog error signal $E_i$ ($E_q$, E) and, when the amplitude absolute value is larger than the first threshold value, keeps the input signal voltage maximum value $V_t$ and the minimum value $V_b$ to default values and simultaneously provides 1 as the attenuation factor to the multiplier 88.

As used herein, the default value means the voltage maximum value and minimum value of the input signals of the ordinary ADC (e.g., ADC 36i) having an unvaried dynamic range.

Thus, when the amplitude absolute value is larger than the first threshold value, the variable ADC 91 performs the same processing as the ordinary ADC such that the converted digital signals are fed to the phase rotator 54 (NCO 66) without being amplified and attenuated in the multiplier 88. That is, this case conforms to the case of the sole interposition of the ADC 36i (36q, 65) with respect to the subtractor 35i (35q, 64, NCO 66).

On the contrary, when the amplitude absolute value has become equal to or lower than the first threshold value, the control unit 92 figures out the voltage maximum value $V_t$ and the minimum value $V_b$ of the variable ADC 91 from the following calculation expression and sets the results into the variable ADC 91.

$$V_t = 1.1 \times D_{MAX} \quad (11)$$

$$V_b = 1.1 \times D_{MIN} \quad (12)$$

Herein, the constant 1.1 is merely given by way of example and can be any numerical value (e.g., 1.05, 1.15) allowing the $V_t$ and $V_b$ to be slightly larger than the $D_{MAX}$ and $D_{MIN}$.

As a result, the dynamic range of the variable ADC 91 is adapted to the amplitude values of the input analog error signals so that the error signal conversion precision is prevented from degrading.

On the other hand, by varying the voltage maximum value and minimum value by the expressions (11) and (12), respectively, the digital signals output from the variable ADC 91 are amplified with the following gain (amplification factor) G.

$$G = (V_t - V_b)/(V_{t0} - V_{b0}) \quad (13)$$

where $V_{t0}$ and $V_{b0}$ are the default values of the maximum value and minimum value of the input signal voltage of the variable ADC 91.

Thus, the control unit 92 imparts 1/G that is the inverse number of this amplification factor G as the attenuation factor to the multiplier 88. As a result, the digital signals amplified by the variable ADC 81 are attenuated to its original magnitude by the multiplier 88 and fed to the phase rotator 54 (NCO 66).

<Ninth Embodiment>

In the third to eighth embodiment described hereinabove, due to the use of the variable gain amplifier 87 the digital error signals may suffer phase distortions (phase rotation) relative to the input signals. In order to compensate for the phase distortions, the ADC 36i (36q, 65) may have a phase shifter provided on its output side.

Figure 11:
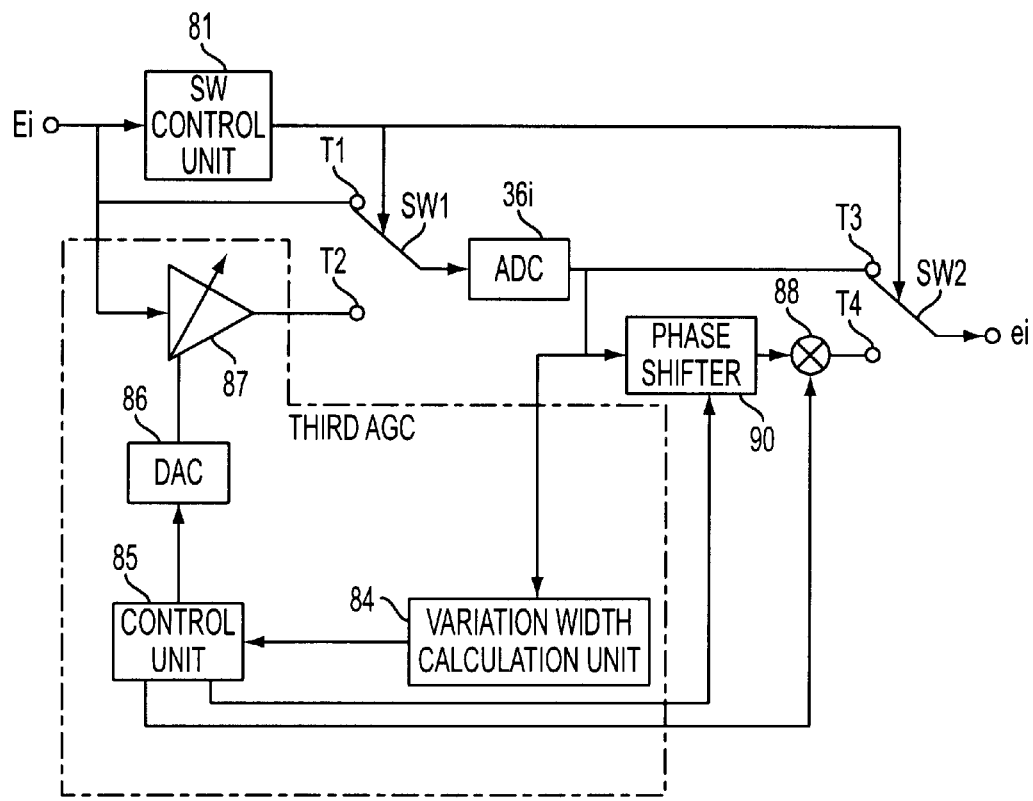
FIG. 11 is a block diagram showing the configuration of an error signal variably amplifying apparatus including a phase shifter disposed on the output side of the ADC of the error signal variably amplifying apparatus of the fifth embodiment shown in FIG. 7.

FIG. 11 is a block diagram showing the configuration of an error signal variably amplifying apparatus including a phase shifter 90 disposed on the output side of the ADC 36i of the error signal variably amplifying apparatus of the fifth embodiment shown in FIG. 7. The solid line of FIG. 12 is a graphic representation showing the relationship between the power gain of the variable gain amplifier 87 and the quantity of phase shift (phase distortion) of its output signals, and the broken line is a graphic representation showing the relationship between the power gain of the variable gain amplifier 87 and the phase set in the phase shifter 90.

Figure 12:
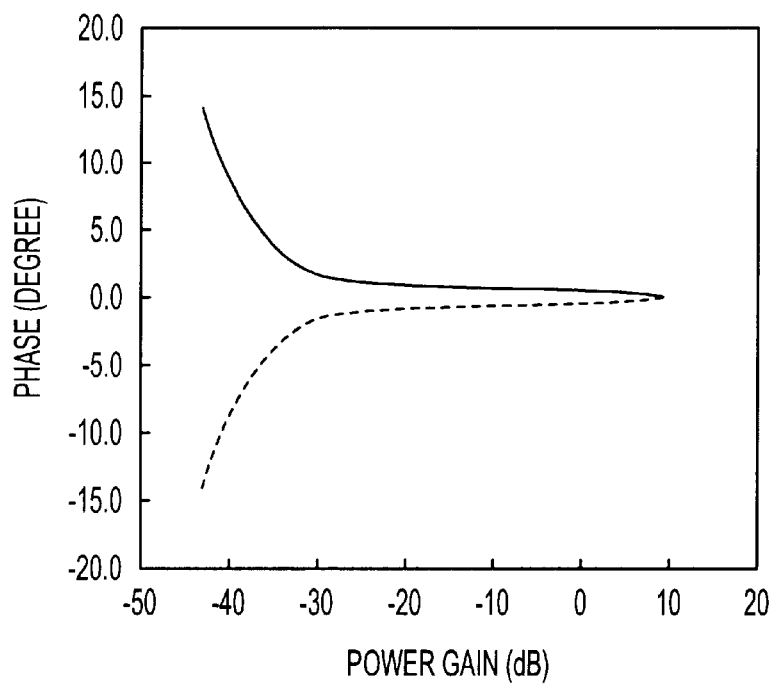
FIG. 12 illustrates in a solid line a graph showing the relationship between the power gain of the variable gain amplifier and the quantity of phase shift of its output signals, and in a broken line a graph showing the relationship between the power gain of the variable gain amplifier and the phase set in the phase shifter.

In its internal memory the control unit 85 holds the relationship between the gain and phase indicated by the broken line of FIG. 12, in the form of a table or a functional expression. Once the control unit 85 sets the gain of the variable gain amplifier 87 to a certain value, it finds the value of the phase corresponding to the set gain from the table or the functional expression stored in the internal memory and sets the thus found phase value into the phase shifter 90.

After impartment from the amplifier 87 through the terminal T2 to the ADC 36i, the analog error signal is converted into a digital error signal and then fed to the phase shifter 90. The phase shifter 90 shifts the phase of the input digital error signal by the phase set by the control unit 85. This achieves compensation (removal) of the phase distortion attributable to the variable gain amplifier 87. After the compensation of the phase distortion by the phase shifter 90, the digital error signal is attenuated by the multiplier 88 and fed via the terminal T4 to the phase rotator 54.

By virtue of such a compensation (removal) of the phase distortion arising from the error signal amplification, a more effective removable is achieved of the transmitter output signal distortions.

The control unit 85 may hold the relationship indicated by the solid line between the gain and the quantity of phase shift, in the form of a table or a functional expression. The control unit 85 may then invert the sign of the obtained phase and thereafter set it into the phase shifter 90. Although this embodiment has been directed to the fifth embodiment shown in FIG. 7 by way of example, this phase shifter 90 is applicable to the other embodiments using the variable gain amplifier.

<Tenth Embodiment>

In the ninth embodiment, the control unit 85 finds the difference d between the input dynamic range of the ADC 36$i$ and the variation width as d=(input dynamic range of the ADC 36$i$)−(variation width) and can provide a control such that when this difference d becomes larger than the predefined third threshold value, the variable gain amplifier 87 can have a larger gain. Herein, the third threshold value can be values such as 80%, 85%, etc., of the input dynamic range of the ADC 36$i$.

Figure 13:
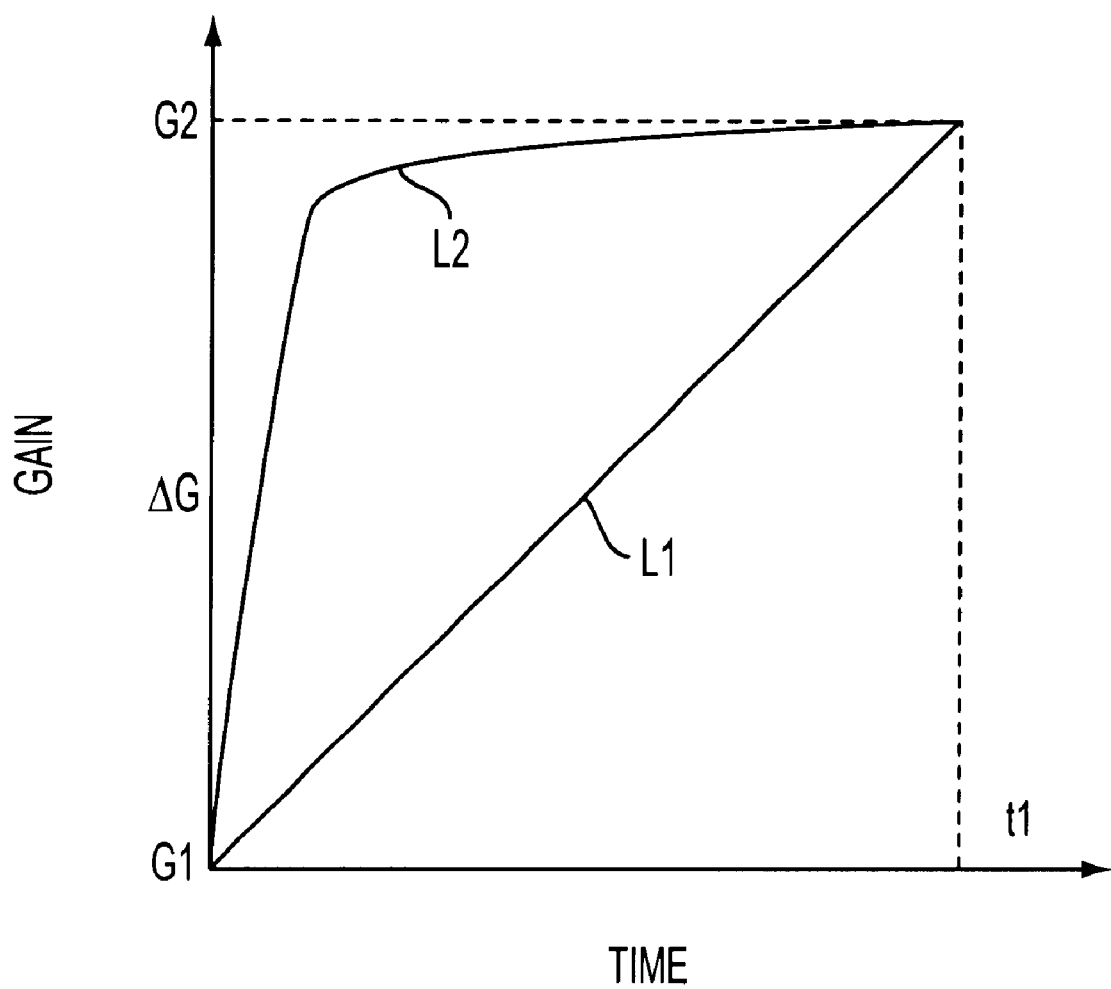
FIG. 13 is a graphic representation showing the relationship between the time and the change of the gain from the current gain of the variable gain amplifier.

With a view to preventing the occurrence of the spurious arising from the abrupt change of the gain of the variable gain amplifier 87, the control unit 85 may provide a control so as to ensure a gradual change of the gain. FIG. 13 is a graphic representation showing the relationship between the time and the change of the gain from the current gain of the variable gain amplifier 87. A gain G1 indicates the gain previous to the change of the gain of the variable gain amplifier 87 and a gain G2 indicates the gain after increase of the gain G1 by increment ΔG over time t1. The time t1 is preferably set to a value not more than the time during which the variation width calculation unit 84 accumulates the digital signals.

The change of the increment ΔG of the gain may be linearly effected as indicated by the straight line L1 or alternatively may gradually be approximated to the gain G2 as indicated by the curved line L2. The control unit 85 includes therein a preset functional expression or table for varying the gain with the lines L1, L2, etc. Such a gradual change can prevent the occurrence of the spurious.

Similar to the gain setting, the phase setting into the phase shifter 90 may be effected when the third threshold value is exceeded. Alternatively, as shown in the straight line L1 or the curved line L2 of FIG. 13, setting may be made in such a manner as to gradually approximate to the target phase.

Furthermore, a plurality of third threshold values such as 80%, 85% and 90% of the dynamic range of the ADC 36$i$ may be provided so that control can be provided to allow the gain to increase by increments ΔG1, ΔG2 and ΔG3 every time the difference d exceeds the respective threshold values. The same applies to the phase setting into the phase shifter 90.

<Eleventh Embodiment>

Figure 15:
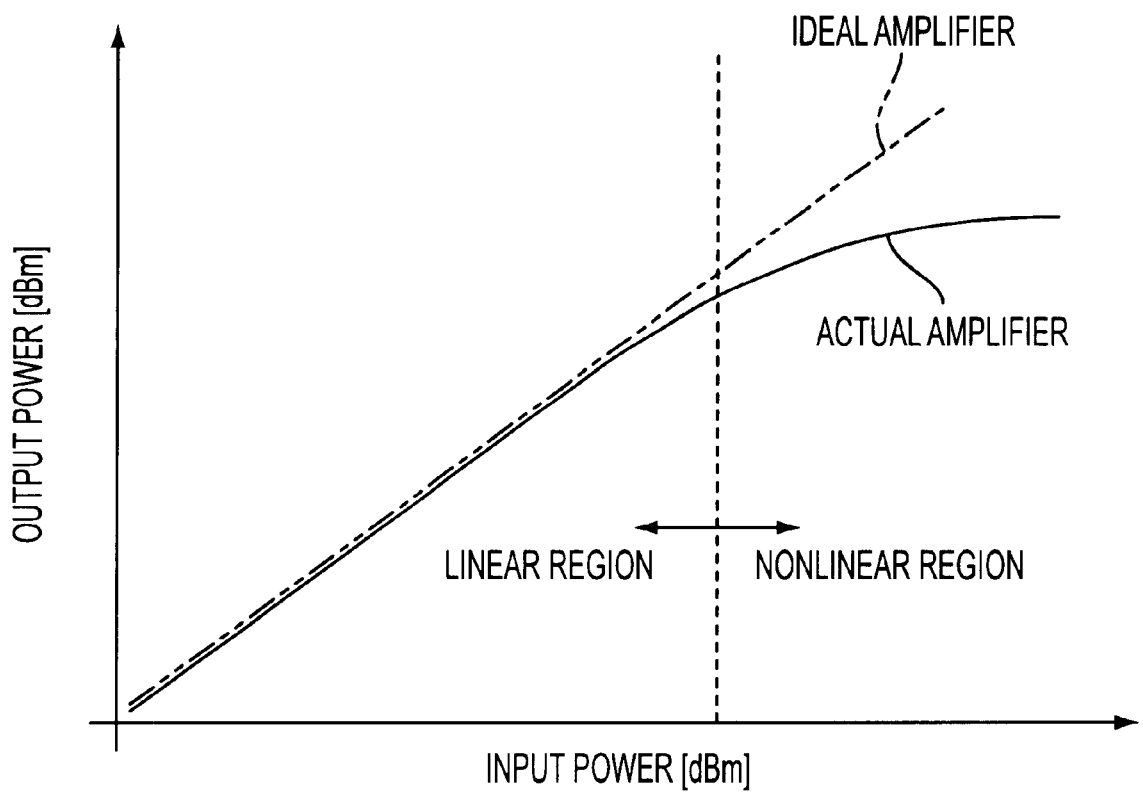
FIG. 15 is a graphic representation showing the amplifier input/output characteristics.
Figure 16:
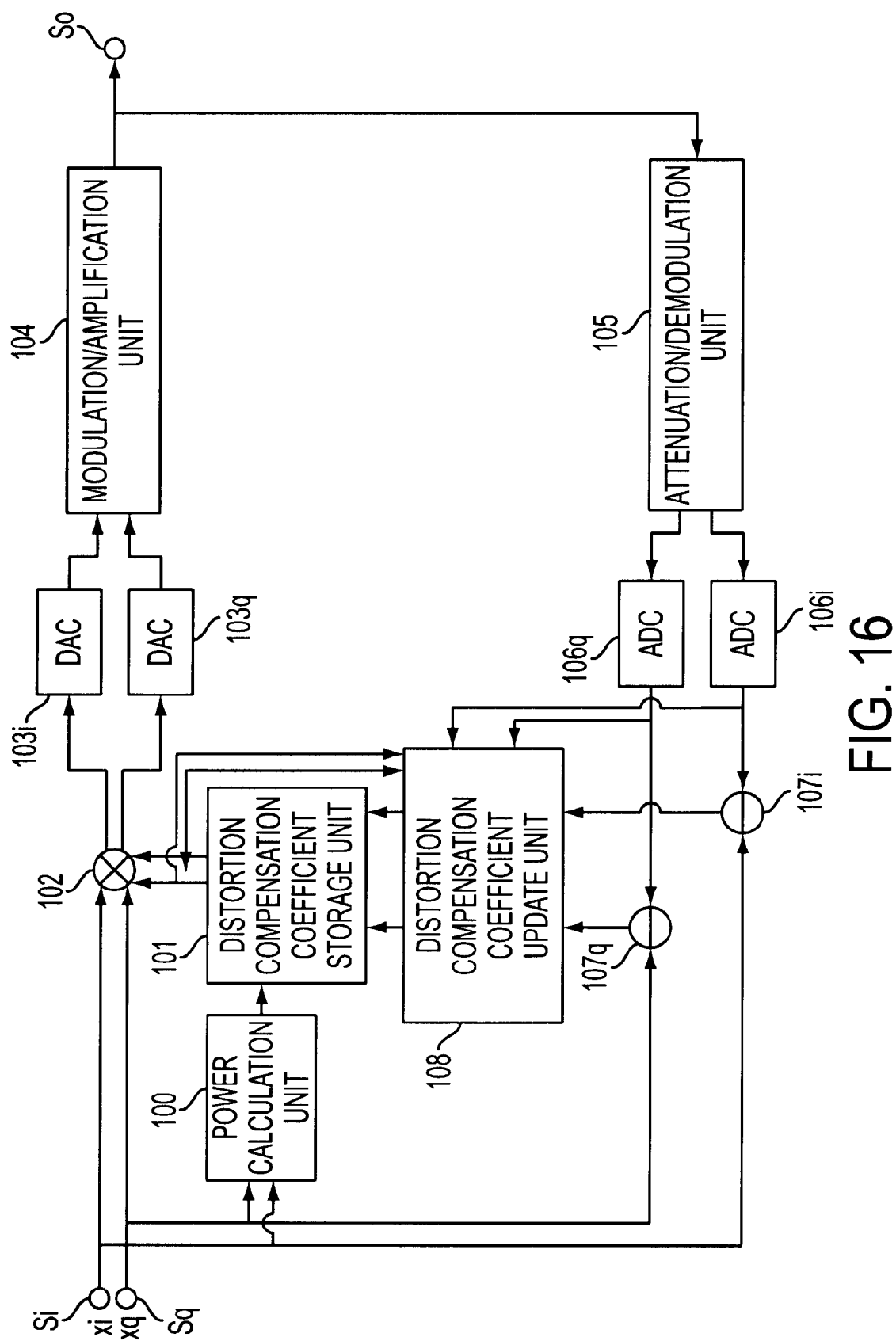
FIG. 16 is a block diagram showing the configuration of a transmitter equipped with a conventional adaptive predistortor type distortion compensator.

As is apparent from FIG. 15, in the nonlinear region of the amplifier, accordingly as the input signals have a larger power, the output signals tend to have a larger distortion, with the result that there lies a larger difference between the actual output signal power and the ideal output signal power. Therefore, the larger the input signal power is, the more the values (amplitude, power) of the analog error signal $E_i$ ($E_q$, E) will increase. For this reason, the distortion compensation coefficient arithmetic unit 5 (7) (see FIGS. 1 and 4) updates the value of the distortion compensation coefficient h toward the gradually increasing values. As a result, the input signal x(n) is converted in the multiplier 31 into a signal having a larger amplitude (power).

On the other hand, even though the multiplier 31 converts the input signal into a signal having a larger amplitude (power), its output signal Z(t) will not be amplified to a signal having a larger amplitude (power) due to the characteristic of the amplifier 16, whereupon the distortion compensation coefficient h will further be updated toward greater values. The iteration of this will lead to a unlimited increase of the distortion compensation coefficient h and may possibly cause a malfunction of the distortion compensation unit 3 (6).

In order to obviate such a situation, a method is provided in which the reference signals $x_i$ and $x_q$ are multiplied by the gain corresponding to the power value p.

Figure 14:
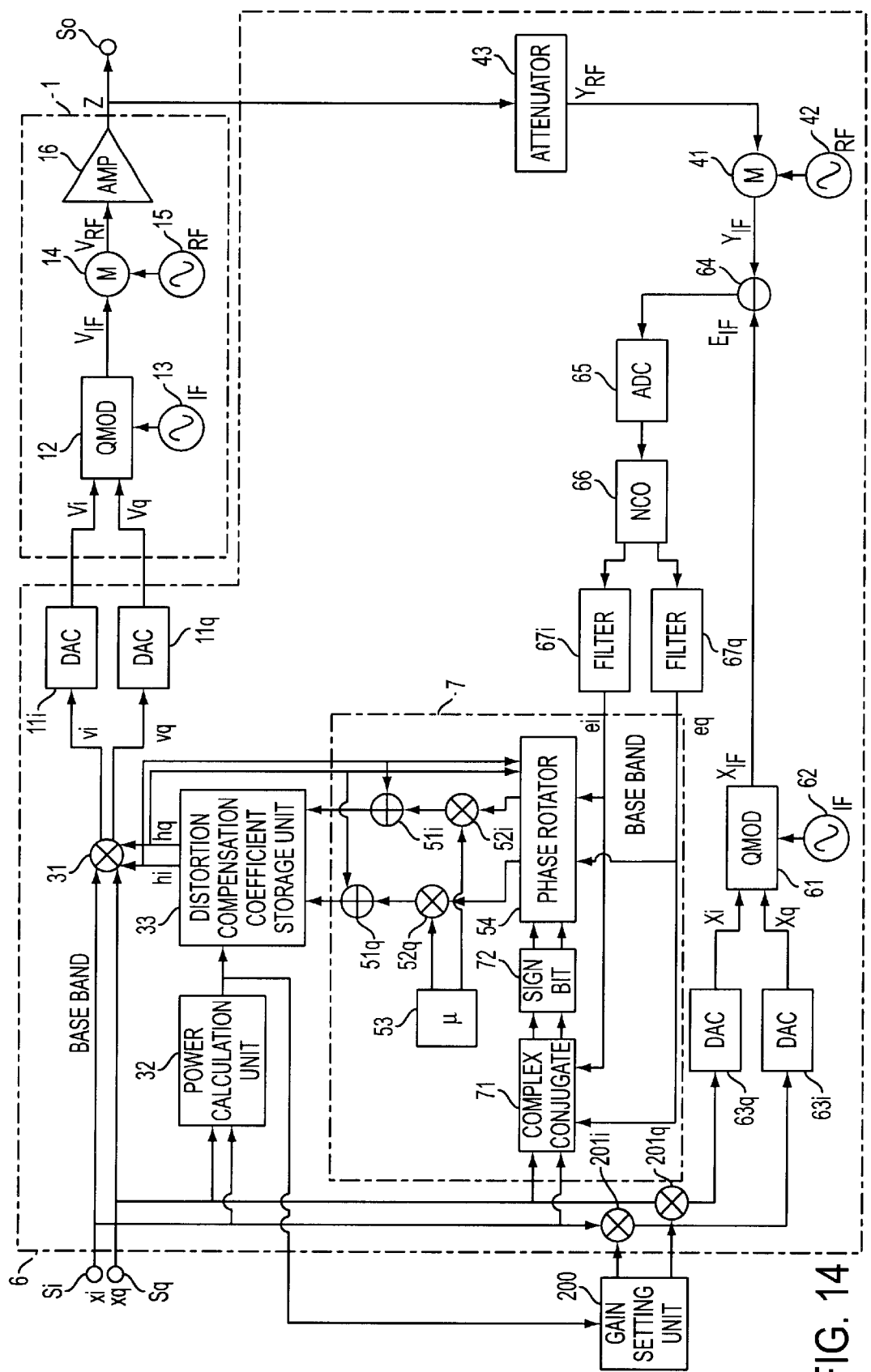
FIG. 14 is a block diagram showing the configuration of a transmitter further including a gain setting unit for setting the gain into the input signals.

FIG. 14 is a block diagram showing the configuration of a transmitter further including a gain setting unit 200 for setting the gain into the reference signals. In FIG. 14, the gain setting unit 200 and multipliers 201$i$ and 201$q$ are added to the second embodiment transmitter (FIG. 4) but instead they may be equally added to the first embodiment transmitter (FIG. 1).

The gain setting unit 200 receives a power value p from the power calculation unit 32 and, when the power value p is not less than a predetermined power value in the nonlinear region of the amplifier 16, feeds a gain corresponding to the power value to the multipliers 201$i$ and 201$q$. As used herein, the "predetermined power value in the nonlinear region" is a power value less than the power value with which the processing for unlimitedly increasing the distortion compensation coefficient h is iterated in the nonlinear region as described hereinabove. The "predetermined power value in the nonlinear region" is determined by simulations, experiments, etc. The "gain corresponding to the power value" is a gain with which the iteration can be prevented of the processing for unlimitedly increasing the distortion compensation coefficient h and it is also determined by simulations, experiments, etc.

The multipliers 201$i$ and 201$q$ multiply the gain fed from the gain setting unit 200 with the input signals $x_i$ and $x_q$ and feeds the results of multiplication as the reference signals to the quadrature modulator 61. The subsequent processings are the same as in the second embodiment set forth hereinabove.

By virtue of this, such a situation can be obviated that the distortion compensation unit 3 (6) may not normally work due to the unlimitedly increased distortion compensation coefficient h.

According to the present invention, the analog-to-digital converter for the conversion of analog signals into digital signals can be one having a lower bid precision and a lower operation frequency than the conventional ones.

While illustrative and presently preferred embodiments of the present invention have been described in detail herein, it is to be understood that the inventive concepts may be otherwise variously embodied and employed and that the appended claims are intended to be construed to include such variations except insofar as limited by the prior art.

What is claimed is:

1. A distortion compensating apparatus for compensating distortions of an amplifier arranged to amplify analog signals converted from digital input signals, said distortion compensating apparatus comprising:

a distortion compensation coefficient application unit which holds distortion compensation coefficients for compensation of distortions of said amplifier, said distortion compensation coefficient application unit applying said held distortion compensation coefficients to said digital input signals;

a first digital-to-analog converter which converts digital signals output from said distortion compensation coefficient application unit into analog signals, said first digital-to-analog converter providing said analog signals as its output to said amplifier;

a first attenuator which attenuates analog output signals from said amplifier to reciprocal times the ideal gain of said amplifier;

a second digital-to-analog converter which converts said digital input signals into analog signals;

a subtractor which finds differential signals between output signals from said second digital-to-analog converter and output signals from said first attenuator;

an analog-to-digital converter which converts said differential signals into digital signals; and a distortion compensation coefficient arithmetic unit which figures out new distortion compensation coefficients based on output signals from said analog-to-digital converter, said distortion compensation coefficient arithmetic unit using said new distortion compensation coefficients to update distortion compensation coefficients held by said distortion compensation coefficient application unit.

2. A distortion compensating apparatus according to claim 1, wherein said distortion compensation coefficient application unit includes:
a power calculation unit which calculates powers of said digital input signals;
a distortion compensation coefficient storage unit which holds distortion compensation coefficients corresponding to power values of said digital input signals, said distortion compensation coefficient storage unit providing as its output distortion compensation coefficients corresponding to power values calculated by said power calculation unit; and
a multiplier which multiplies said digital input signals by distortion compensation coefficients output from said distortion compensation coefficient storage unit.

3. A distortion compensating apparatus according to claim 1, wherein said distortion compensation coefficient arithmetic unit figures out new distortion compensation coefficients based on the least mean square algorithm or the clipped least mean square algorithm.

4. A distortion compensating apparatus according to claim 1, wherein said digital input signals consist of I signals of in-phase components and Q signals of orthogonal components, and wherein said distortion compensation coefficients are in the form of complex numbers each having a distortion compensation coefficient for a real part and a distortion compensation coefficient for an imaginary part.

5. A distortion compensating apparatus according to claim 1, wherein said digital input signals are base band signals, and wherein output signals from said amplifier are radio frequency band signals, and wherein signals input to said subtractor are intermediate frequency band signals.

6. A distortion compensating apparatus according to claim 1, further comprising:

a variable gain amplifier disposed between said subtractor and said analog-to-digital converter, said variable gain amplifier accepting said differential signals, said variable gain amplifier amplifying said differential signals by a variable gain to impart said amplified differential signals to said analog-to-digital converter;

a second attenuator disposed between said analog-to-digital converter and said distortion compensation coefficient arithmetic unit, said second attenuator variably attenuating output signals of said analog-to-digital converter with an attenuation factor equal to the reciprocal of the gain of said variable gain amplifier;

a control unit which provides a control of the gain of said variable gain amplifier and the attenuation factor of said second attenuator depending on the magnitude of the amplitudes or powers of said differential signals;

a first switch which changes over signals fed to said analog-to-digital converter to either said differential signals or output signals of said variable gain amplifier;

a second switch which effects a changeover such that said distortion compensation coefficient arithmetic unit receives either output signals of said analog-to-digital converter or output signals of said second attenuator; and a switch control unit which provides a control of said first switch and said second switch on the basis of absolute values of amplitudes of said differential signals, said switch control unit when said first switch is switched to said differential signals, changing over said second switch to said analog-to-digital converter, said switch control unit when said first switch is switched to said variable gain amplifier, changing over said second switch to said second attenuator.

7. A distortion compensating apparatus according to claim 6, wherein said switch control unit includes a timer, said timer changing over said first switch to said differential signals and said second switch to said analog-to-digital converter for the duration after activation of said distortion compensating apparatus till the elapse of time toward the convergence of said differential signals in place of said differential signal amplitude absolute values, said timer changing over said first switch to said variable gain amplifier and said second switch to said second attenuator after the elapse of time toward the convergence of said differential signals.

8. A distortion compensating apparatus according to claim 6, wherein said control unit finds an average power of said differential signals for a predetermined period of time, said control unit providing a control such that when said average power is smaller than a predetermined threshold value, the gain of said variable gain amplifier becomes larger than the current value but that when said average power is equal to or larger than said threshold value, the gain of said variable gain amplifier becomes smaller than the current value.

9. A distortion compensating apparatus according to claim 6, wherein said control unit provides a control of the gain of said variable gain amplifier and the attenuation factor of said second attenuator on the basis of amplitude values of said differential signals.

10. A distortion compensating apparatus according to claim 6, wherein said control unit provides a control of the gain of said variable gain amplifier and the attenuation factor of said second attenuator on the basis of the difference between the variation width of output signals of said analog-to-digital converter and the input dynamic range of said analog-to-digital converter.

11. A distortion compensating apparatus according to claim 10, wherein said control unit provides a control such that when the difference between said variation width and said input dynamic range exceeds a predetermined threshold value, the gain of said variable gain amplifier becomes larger than the current value.

12. A distortion compensating apparatus according to claim 10, wherein said control unit has a plurality of predetermined different threshold values for use in comparison with the difference between said variation width and said input dynamic range, said control unit having a plurality of gain increments corresponding to said threshold values, said control unit providing a control such that each time said difference becomes larger than any one of said plurality of threshold values, the gain of said variable gain amplifier increases by the increment corresponding to said threshold value.

13. A distortion compensating apparatus according to claim 1, wherein said distortion compensation coefficient arithmetic unit figures out a new distortion compensation coefficient on the basis of the clipped least mean square algorithm, said distortion compensating apparatus further comprising:

a variable gain amplifier disposed between said subtractor and said analog-to-digital converter, said variable gain amplifier accepting said differential signals, said variable gain amplifier amplifying said differential signals by a variable gain to impart said amplified differential signals to said analog-to-digital converter; and a control unit which provides a control of the gain of said variable gain amplifier and the step size of said distortion compensation coefficient arithmetic unit depending on the magnitude of the amplitudes or powers of said differential signals.

14. A distortion compensating apparatus according to claim 6, further comprising:

a phase shifter disposed between said analog-to-digital converter and said subtractor, said phase shifter shifting the phases of output signals of said analog-to-digital converter by the preset quantity of phase shifting, and wherein said control unit sets the quantity of phase shifting into said phase shifter such that the phases of output signals of said variable gain amplifier are restored by the quantity of phase shifting corresponding to the gain of said variable gain amplifier on the basis of the relationship between the value of the gain of said variable gain amplifier and the quantity of phase shifting of output signals of said variable gain amplifier corresponding to the value of said gain.

15. A distortion compensating apparatus according to claim 14, wherein said control unit gradually varies the quantity of phase shifting of said phase shifter over a predetermined time.

16. A distortion compensating apparatus according to claim 6, wherein said control unit gradually varies the gain of said variable gain amplifier.

17. A distortion compensating apparatus according to claim 1, wherein said analog-to-digital converter is an input dynamic range variable analog-to-digital converter, said distortion compensating apparatus further comprising:

a control unit which finds the maximum value and the minimum value of output signals of said analog-to-digital converter, said control unit providing a control of the magnitude of the dynamic range of said analog-to-digital converter on the basis of said maximum value and said minimum value.

18. A distortion compensating apparatus according to claim 1, further comprising:

a power calculation unit which calculates power values of said digital input signals;

a gain setting unit which sets gains of said digital input signals on the basis of said power values obtained by said power calculation unit; and an amplifying unit which amplifies said digital input signals by the gain of said gain setting unit, said amplifying unit converting said amplified digital input signals into analog signals and thereafter feeding said analog signals to said subtractor.

19. A distortion compensating method for compensating distortions of an amplifier which amplifies analog signals converted from digital input signals, said method comprising the steps of:

applying distortion compensation coefficients for compensating distortions of said amplifier to said digital input signals;

converting said digital signals having said distortion compensation coefficients applied thereto into analog signals and thereafter feeding said analog signals to said amplifier;

attenuating analog output signals from said amplifier to the reciprocal times the ideal gain of said amplifier;

converting said digital input signals into analog signals to find differential signals between said analog signals and said attenuated analog output signals;

converting said differential signals into digital signals; and determining a new distortion compensation coefficient on the basis of differential signals converted into said digital signals, to update said distortion compensation coefficients by said new distortion compensation coefficient.

20. A distortion compensating apparatus for compensating distortions of an amplifier, comprising:

a first digital-to-analog converter which converts digital input signals into first analog signals;

an attenuator which attenuates output signals from said amplifier to reciprocal times the ideal gain of said amplifier;

a first arithmetic circuit which effects in an analog region an arithmetic for obtaining distortion components of said amplifier from the differences between said first analog signals and output signals from said attenuator;

a second arithmetic circuit which effects in a digital region an arithmetic of distortion compensation coefficients for canceling the distortion components, and which applies said distortion compensation coefficients to said digital input signals depending on the magnitudes of the distortion components; and a second digital-to-analog converter which converts digital output signals from said second arithmetic circuit into second analog signals and outputs the second analog signals to said amplifier.

21. A distortion compensating method for compensating distortions of an amplifier, said method comprising the steps of:

converting digital input signals into first analog signals;

attenuating output signals from said amplifier to reciprocal times the ideal gain of said amplifier;

effecting in an analog region an arithmetic for obtaining distortion components of said amplifier from the differences between said first analog signals and the attenuated output signals;

effecting in a digital region an arithmetic of distortion compensation coefficients for canceling the distortion components, and which applies said distortion compensation coefficients to said digital input signals depending on the magnitudes of the distortion components; and converting the digital input signals after applying the distortion compensation coefficients, into second analog signals, and outputting the second analog signals to said amplifier.

* * * * *

UNITED STATES PATENT AND TRADEMARK OFFICE
CERTIFICATE OF CORRECTION

PATENT NO. : 6,552,609 B2
DATED : April 22, 2003
INVENTOR(S) : Hajime Hamada et al.

It is certified that error appears in the above-identified patent and that said Letters Patent is hereby corrected as shown below:

<u>Title page,</u>
Item [75], Inventors, should read as follows:
-- [75] Inventors: Hajime Hamada, Kawasaki (JP)
                                 Yasuyuki Oishi, Kawaski (JP)
                                 Tokuro Kubo, Kawasaki (JP)
                                 Takayoshi Ode, Kawasaki (JP)
                                 Kazuo Nagatani, Kawasaki (JP)
                                 Hiroyoshi Ishikawa, Kawasaki (JP) --

Signed and Sealed this

Twenty-ninth Day of June, 2004

JON W. DUDAS
*Acting Director of the United States Patent and Trademark Office*